(12) United States Patent
Choraku et al.

(10) Patent No.: US 11,749,874 B2
(45) Date of Patent: Sep. 5, 2023

(54) BALANCED-TYPE CIRCULAR DISK RESONATOR, DIELECTRIC PROPERTY MEASUREMENT METHOD, AND DIELECTRIC PROPERTY MEASUREMENT SYSTEM

(71) Applicant: FUJITSU LIMITED, Kawasaki (JP)

(72) Inventors: Kohei Choraku, Yokohama (JP); Yoshiyuki Hiroshima, Nakano (JP)

(73) Assignee: FUJITSU LIMITED, Kawasaki (JP)

( * ) Notice: Subject to any disclaimer, the term of this patent is extended or adjusted under 35 U.S.C. 154(b) by 220 days.

(21) Appl. No.: 17/210,561

(22) Filed: Mar. 24, 2021

(65) Prior Publication Data

US 2021/0367315 A1 Nov. 25, 2021

(30) Foreign Application Priority Data

May 21, 2020 (JP) .................. 2020-088884

(51) Int. Cl.
*H01P 1/30* (2006.01)
*H01P 7/10* (2006.01)
*G01R 33/12* (2006.01)
*H01P 1/203* (2006.01)

(52) U.S. Cl.
CPC ............ *H01P 1/30* (2013.01); *G01R 33/1223* (2013.01); *H01P 1/20309* (2013.01); *H01P 7/10* (2013.01)

(58) Field of Classification Search
CPC ........... H01P 1/30; H01P 1/20309; H01P 7/10
USPC ...................... 333/229, 234, 219.1
See application file for complete search history.

(56) References Cited

U.S. PATENT DOCUMENTS 7,250,833 B2 * 7/2007 Eddy .................. H01P 1/30
333/202

FOREIGN PATENT DOCUMENTS

JP H07-42202 U 7/1995
JP 2014-106224 A 6/2014

* cited by examiner

*Primary Examiner* — Rakesh B Patel
(74) *Attorney, Agent, or Firm* — Fujitsu Patent Center

(57) ABSTRACT

A balanced-type circular disk resonator includes a circular conductive layer, a conductive member including a first conductive portion provided on a first surface of the circular conductive layer to enable a first dielectric board, a dielectric property of which is measured, to be placed between the first conductive portion and the circular conductive layer, and a second conductive portion provided on a second surface of the circular conductive layer to enable a second dielectric board, a dielectric property of which is measured, to be placed between the second conductive portion and the circular conductive layer, the second surface being opposite to the first surface with regard to the circular conductive layer, and a temperature adjustment unit coupled to the conductive member and configured to adjust temperatures of the first conductive portion and the second conductive portion.

10 Claims, 12 Drawing Sheets

BALANCED-TYPE CIRCULAR DISK RESONATOR, DIELECTRIC PROPERTY MEASUREMENT METHOD, AND DIELECTRIC PROPERTY MEASUREMENT SYSTEM

CROSS-REFERENCE TO RELATED APPLICATION

This application is based upon and claims the benefit of priority of the prior Japanese Patent Application No. 2020-088884, filed on May 21, 2020, the entire contents of which are incorporated herein by reference.

FIELD

The embodiments discussed herein are related to a balanced-type circular disk resonator, a dielectric property measurement method, and a dielectric property measurement system.

BACKGROUND

There has been known a technique for measuring a permittivity and a dielectric loss of a sample by using a circular resonator, which is prepared by sandwiching a disk resonator sheet with a pair of the samples and further sandwiching the pair of the samples between a pair of metal plates such that centers of the pair of metal plates coincide with centers of the pair of the samples. In this circular resonator, a resonant electromagnetic wave inputted from a probe provided to one of the metal plates is outputted from a probe provided to the other metal plate.

There has also been known a dielectric resonator for use in a filter or a resonator in a microwave region, which is formed by supporting a dielectric block used as a hollow resonator with an insulating support and being covered with a conductive casing. Concerning the above-mentioned dielectric resonator, there has also been known a technique to provide the insulating support supporting the resonator with a heat generating member that generates heat by supplying electric energy thereto.

Related techniques are disclosed in, for example, Japanese Laid open Patent Publication No. 2014-106224 and Japanese Laid-open Utility Model Publication No. 7-42202.

SUMMARY

According to an aspect of the embodiments, a balanced-type circular disk resonator includes: a circular conductive layer; a conductive member including: a first conductive portion provided on a first surface of the circular conductive layer to enable a first dielectric board, a dielectric property of which is measured, to be placed between the first conductive portion and the circular conductive layer; and a second conductive portion provided on a second surface of the circular conductive layer to enable a second dielectric board, a dielectric property of which is measured, to be placed between the second conductive portion and the circular conductive layer, the second surface being opposite to the first surface with regard to the circular conductive layer; and a temperature adjustment unit coupled to the conductive member and configured to adjust temperatures of the first conductive portion and the second conductive portion.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1A:
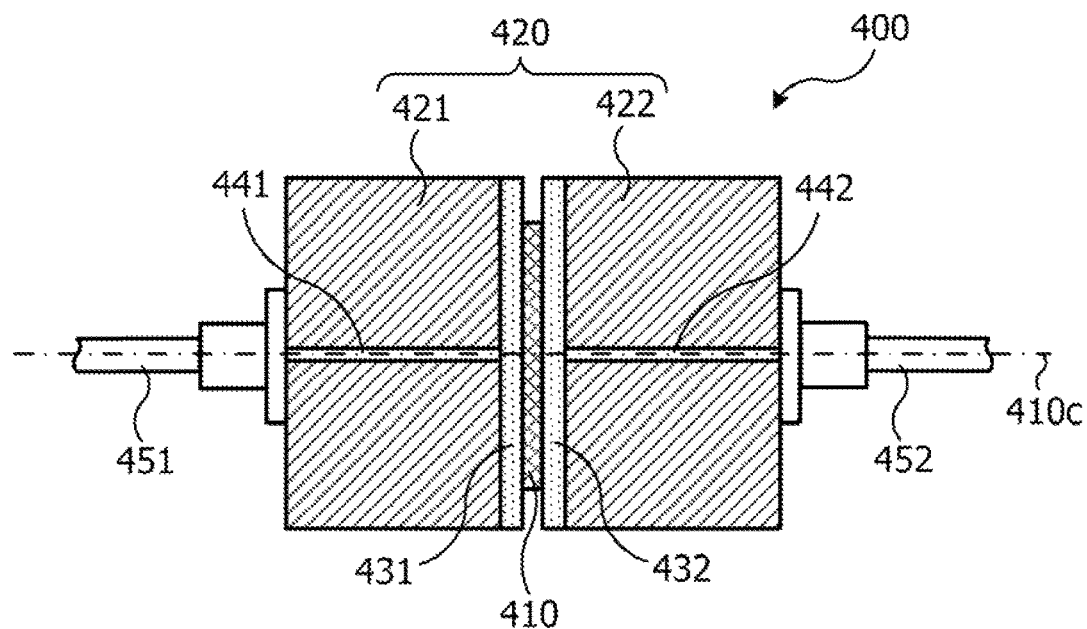
FIGS. 1A and 1B are diagrams for describing an example of a balanced-type circular disk resonator.

The use of the circular resonator or the balanced-type circular disk resonator as described above is one of techniques for measuring a dielectric property such as a relative permittivity and a dissipation factor of a dielectric material.

In the field of electronic devices, there may be a case where a temperature dependency of the dielectric property of a dielectric material used in an electronic component is expected to be figured out in order to operate the electronic component normally at the temperature in its usage environment. As an example of a method of figuring out the temperature dependency of the dielectric property of the dielectric material, there is a method of coupling a balanced-type circular disk resonator to a cable (which is also referred to as a probe or an excitation wire) for inputting and outputting an electromagnetic wave, then arranging this resonator in an isothermal bath set to a predetermined temperature, and measuring a dielectric property of a dielectric board serving as a sample of the dielectric material at the predetermined temperature.

However, a portion of the cable coupled to the balanced-type circular disk resonator is arranged together with this resonator in the isothermal bath set to the predetermined temperature according to this method. As a consequence, there is a risk of causing an error in the dielectric property of the dielectric board to be measured, which is attributed to an effect of a temperature dependency intrinsic to the cable.

In the trend of speeding up information and communication technology (ICT) instruments in recent years, for example, reduction in signal transmission loss attributed to a dielectric material used in an electronic component such as a printed board has been promoted. In order to realize a low-loss electronic component in a high-frequency band, it is important to accurately figure out dielectric properties such as a relative permittivity (Dk) and a dissipation factor (Df) of a dielectric material used therein. Dielectric properties of a dielectric material used in an electronic component has heretofore been measured within a range of a relatively low frequency such as 1 GHz. However, along with the speeding up of a data transfer speed in these days, the range of frequency to be measured is expanding to a relatively high frequency range of 110 GHz and the like. The dissipation factor of the dielectric material tends to be lowered to an order of $10^{-3}$ so as to reduce the signal transmission loss, thus leading to an increase in difficulty of measurement.

A balanced-type circular disk resonator method is a technique for measuring a dielectric property in a perpendicular direction of a dielectric material in a microwave band to a millimeter-wave band. The balanced-type circular disk resonator method adopts an excitation structure in which a circular copper foil is sandwiched between two dielectric boards serving as samples of a dielectric material, then the copper foil and the dielectric boards are further sandwiched between two conductor plates such as pure copper flat plates, and electric fields are coupled by using coaxial excitation wires through an excitation hole provided on the center axis of the circular copper foil, for example. A measuring device called a balanced-type circular disk resonator is mainly used n this measurement.

A configuration example of the balanced-type circular disk resonator and an example of measurement of a dielectric property using the balanced-type circular disk resonator will be discussed.

Figure 1B:
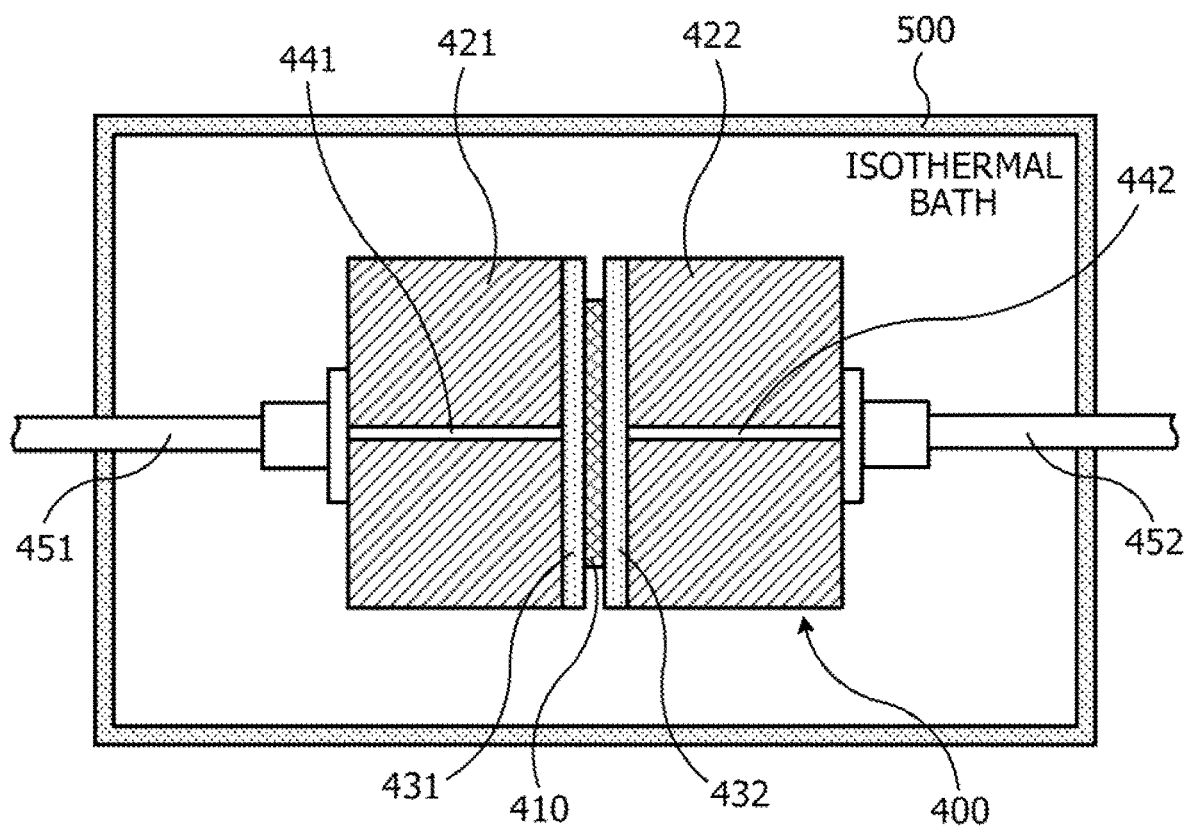

FIGS. 1A and 1B are diagrams for describing an example of the balanced-type circular disk resonator. FIG. 1A schematically illustrates a cross-sectional view of a main part of the example of the balanced-type circular disk resonator. FIG. 1B schematically illustrates a cross-sectional view of the main part of the example of the balanced-type circular disk resonator at the time of measurement of the dielectric property.

A balanced-type circular disk resonator 400 illustrated in FIG. 1A includes a circular copper foil 410 and a conductive member 420. The conductive member 420 includes a conductive portion 421 provided on one surface of the circular copper foil 410 and a conductive portion 422 provided on another surface of the circular copper foil 410. A pure copper flat plate is used for each of the conductive portion 421 and the conductive portion 422, for example. A dielectric board 431 and a dielectric board 432 serving as the samples targeted for measurement of the dielectric property are sandwiched between the circular copper foil 410 and the conductive portion 421 as well as between the circular copper foil 410 and the conductive portion 422, respectively. Dielectric flat plates having the same material quality and the same thickness are used for the dielectric board 431 and the dielectric board 432. The conductive portion 421 and the conductive portion 422 are provided with an excitation hole 441 and an excitation hole 442, respectively. The conductive portion 421 and the conductive portion 422 are provided such that the excitation hole 441 and the excitation hole 442 are located on a center axis 410c of the circular copper foil 410.

An excitation wire 451 and an excitation wire 452 are coupled to positions of the excitation hole 441 of the conductive portion 421 and the excitation hole 442 of the conductive portion 422 of the balanced-type circular disk resonator 400 having the above-described configuration, respectively. A coaxial cable, for example, is used for each of the excitation wire 451 and the excitation wire 452. The excitation is brought about by electric field coupling by using the excitation wire 451 and the excitation wire 452 through the excitation hole 441 and the excitation hole 442 provided on the center axis 410c of the circular copper foil 410. For example, a resonant electromagnetic wave inputted from the one excitation wire 451 is outputted from the other excitation wire 452. The relative permittivity and the dissipation factor of each of the dielectric board 431 and the dielectric board 432 targeted for measurement are measured based on a resonance frequency and a value Q at no load which are measured with the balanced-type circular disk resonator 400.

Regarding an electronic component such as an in-vehicle millimeter-wave radar that is desired to operate normally under a relatively severe temperature environment, there may be a case where it is desired to figure out a temperature dependency of a dielectric property of a dielectric material used therein such as a dielectric material of a printed board used therein.

In this case, a method of arranging the balanced-type circular disk resonator 400 that uses boards corresponding to the dielectric material targeted for measurement as the dielectric board 431 and the dielectric board 432 in an isothermal bath 500 as illustrated in FIG. 1B is adopted, for example. The measurement is carried out while arranging the balanced-type circular disk resonator 400 in the isothermal bath 500, drawing the excitation wire 451 and the excitation wire 452 coupled to the balanced-type circular disk resonator 400 out of the isothermal bath 500, thereby stabilizing the dielectric board 431 and the dielectric board 432 at a set temperature. The dielectric properties of the dielectric board 431 and the dielectric board 432 at the set temperature are measured based on values obtained by the measurement. The isothermal bath 500 is set to a temperature in a range from −55° C. to 150° C., for example, and the dielectric properties are measured while stabilizing the temperatures of the dielectric board 431 and the dielectric board 432 in terms of a set temperature or temperatures at one or more points in the aforementioned temperature range, or in other words, in terms of measurement temperature or temperatures of the dielectric properties.

However, in the method using the isothermal bath 500 as illustrated in FIG. 1B, portions of the excitation wire 451 and the excitation wire 452 coupled to the balanced-type circular disk resonator 400 are arranged in the isothermal bath 500 together with the balanced-type circular disk resonator 400. In this case, the dielectric properties of the dielectric board 431 and the dielectric board 432 may cause errors due to deteriorations of the excitation wire 451 and the excitation wire 452 by heat or to an effect of temperature dependency provided to the excitation wire 451 and the excitation wire 452.

High-frequency coaxial cables used for the excitation wire 451 and the excitation wire 452 are relatively expansive. Therefore, in order to suppress the heat deterioration thereof, a method designed to avoid or reduce exposure of the excitation wire 451 and the excitation wire 452 to the heat is expected. However, it is difficult to provide such an arrangement to the balanced-type circular disk resonator 400 illustrated in FIGS. 1A and 1B because of its structure.

A possible option for suppressing errors in measurement due to the temperature dependency of the excitation wire 451 and the excitation wire 452 is to measure the temperature dependency of the excitation wire 451 alone and the temperature dependency of the excitation wire 452 alone in advance and to correct the measurement result obtained by the method using the isothermal bath 500 as illustrated in FIG. 1B by subtracting the measured temperature dependencies therefrom.

Figure 2:
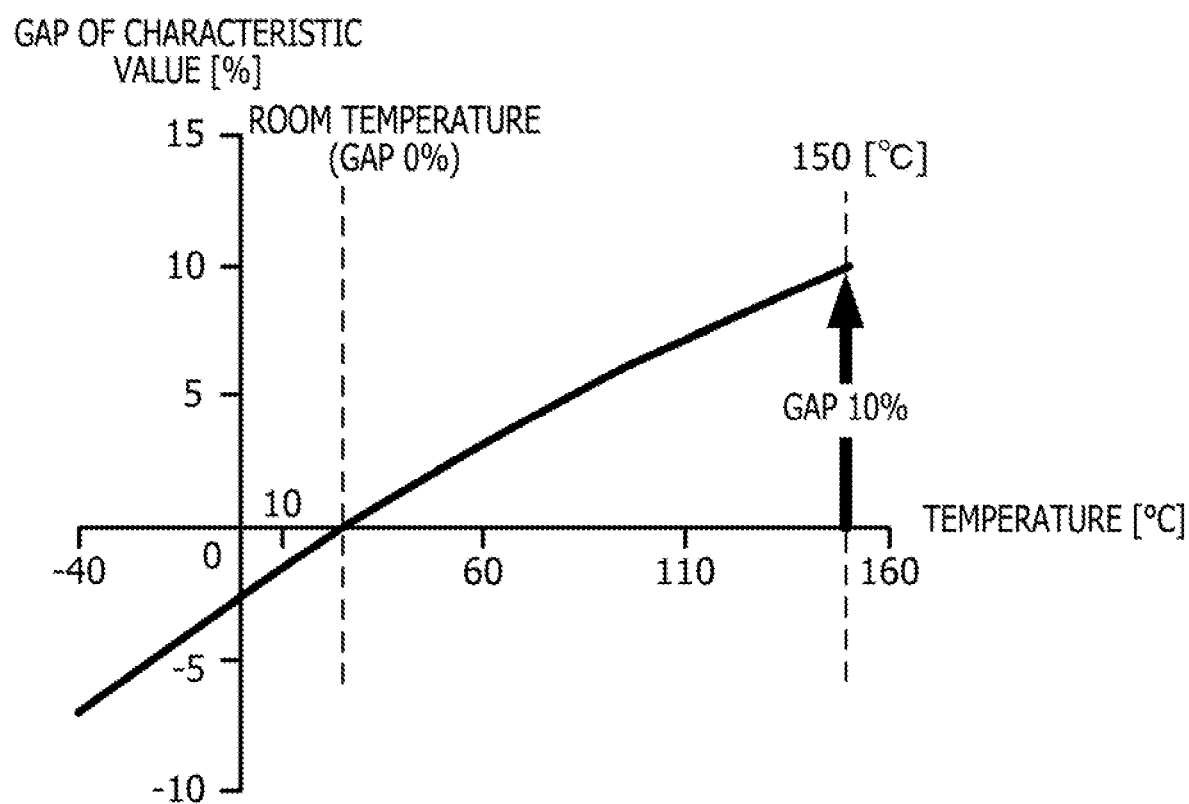
FIG. 2 is a diagram for describing an example of a temperature dependency of an excitation wire.

FIG. 2 is a diagram for describing an example of the temperature dependency of the excitation wire, FIG. 2 schematically illustrates a gap of a characteristic value of an excitation wire with respect to a temperature.

As illustrated in FIG. 2, each of the excitation wire 451 and the excitation wire 452 may exhibit a tendency that a gap of a characteristic value grows larger with an increase in temperature. For example, in the case of FIG. 2 where a characteristic value at room temperature is used as a reference (a gap at 0%), a gap of the characteristic value accounts for 10% at 150° C. The gap of the characteristic value of each of the excitation wire 451 and the excitation wire 452 due to the temperature also varies with the type or a thermal history of each of the excitation wire 451 and the excitation wire 452. As a consequence, the measurement of the temperature dependencies of the excitation wire 451 and the excitation wire 452 in each time of the measurement carried out while arranging the balanced-type circular disk resonator 400 in the isothermal bath 500 and the use of the measured temperature dependencies for correction of the measurement result may lead to an increase in the number of steps of measurement, complication associated therewith, and so forth.

In addition, the measurement while arranging the balanced-type circular disk resonator 400 in the isothermal bath 500 may take a relatively long time, such as several hours, in order to stabilize the temperature. As a consequence, in the case of performing the measurement at two or more measurement temperatures, the measurement of the dielectric properties of the dielectric board 431 and the dielectric board 432 of the same type may take day-long work in some cases.

As described above, the measurement of the dielectric properties of related art using the balanced-type circular disk resonator 400 or arranging this resonator in the isothermal bath 500 may face a difficulty in measuring the dielectric properties of the dielectric board 431 and the dielectric board 432 at the predetermined measurement temperatures while suppressing errors because of the effects of the excitation wire 451 and the excitation wire 452. The method of carrying out the correction based on the temperature dependencies of the excitation wire 451 and the excitation wire 452 in order to reduce the above-mentioned errors may lead to an increase in the number of steps of the measurement, complication associated therewith, and so forth. If the time for stabilizing the temperatures of the dielectric board 431 and the dielectric board 432 is shortened in the method of using the isothermal bath 500 in order to reduce the chance of extension of the measurement time, then it may be difficult to measure the dielectric properties at high accuracy.

In view of the above-mentioned circumstances, the use of methods to be discussed below as embodiments will enable measurement of a dielectric property of a dielectric board at a predetermined temperature by employing a balanced-type circular disk resonator.

First Embodiment

Figure 3A:
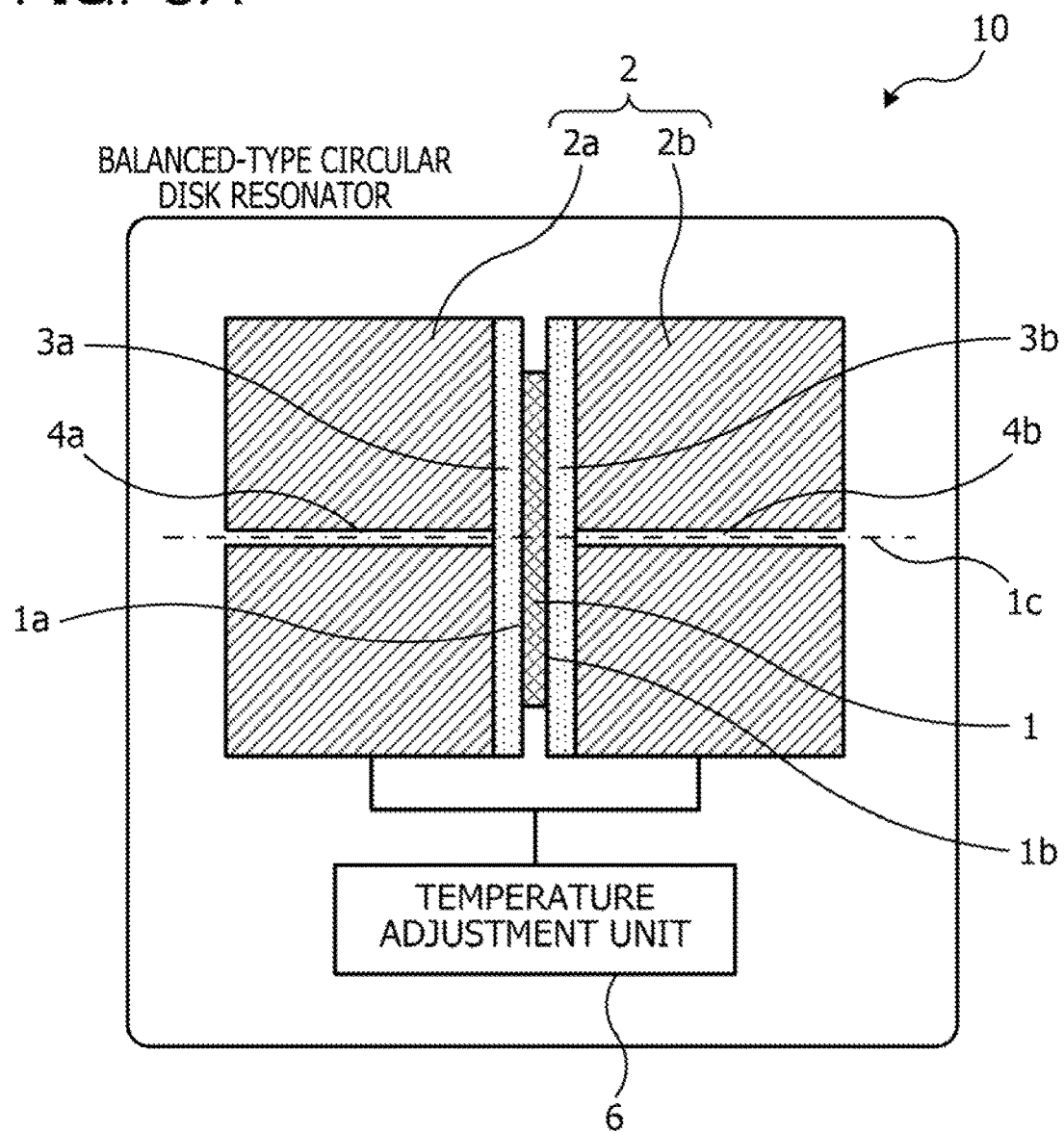
FIGS. 3A and 3B are diagrams for describing an example of a balanced-type circular disk resonator according to a first embodiment.
Figure 3B:
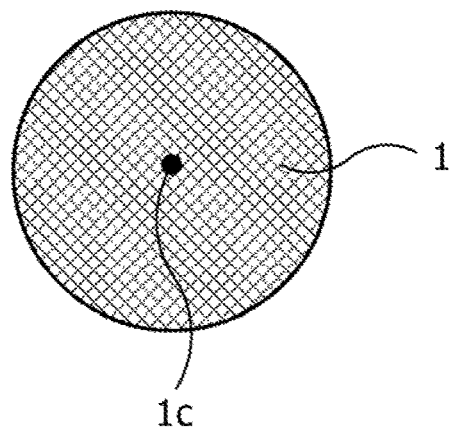

FIGS. 3A and 3B are diagrams for describing an example of a balanced-type circular disk resonator according to a first embodiment. FIG. 3A schematically illustrates a configuration example of the balanced-type circular disk resonator. FIG. 3A illustrates a cross-sectional view of some elements (a circular conductive layer, a conductive member, and dielectric boards) of the balanced-type circular disk resonator. FIG. 3B schematically illustrates a plan view of the circular conductive layer used in the balanced-type circular disk resonator.

A balanced-type circular disk resonator 10 illustrated in FIG. 3A includes a circular conductive layer 1 and a conductive member 2 as illustrated in FIG. 3B. A circular conductive foil such as a circular copper foil is used for the circular conductive layer 1. The conductive member 2 includes a conductive portion 2a provided on one surface 1a of the circular conductive layer 1 and a conductive portion 2b provided on another surface 1b of the circular conductive layer 1. A conductor flat plate such as a copper flat plate is used for each of the conductive portion 2a and the conductive portion 2b. A dielectric board 3a and a dielectric board 3b serving as samples targeted for measurement of a dielectric property are sandwiched between the circular conductive layer 1 and the conductive portion 2a as well as between the circular conductive layer 1 and the conductive portion 2b, respectively. Dielectric flat plates having the same material quality and the same thickness are used for the dielectric board 3a and the dielectric board 3b. The conductive portion 2a and the conductive portion 2b are provided with an excitation hole 4a and an excitation hole 4b, respectively. The conductive portion 2a and the conductive portion 2b are provided such that the excitation hole 4a and the excitation hole 4b are located on a center axis 1c of the circular conductive layer 1.

Excitation wires (not illustrated) are coupled to positions of the excitation hole 4a of the conductive portion 2a and the excitation hole 4b of the conductive portion 2b of the balanced-type circular disk resonator 10 having the above-described configuration, respectively. A coaxial cable, for example, is used for each of the excitation wires. The excitation is brought about by electric field coupling by using the excitation wires through the excitation hole 4a and the excitation hole 4b provided on the center axis 1c of the circular conductive layer 1. For example, a resonant electromagnetic wave inputted from the excitation wire coupled to the one conductive portion 2a is outputted from the excitation wire on the other conductive portion 2b. The relative permittivity and the dissipation factor of each of the dielectric board 3a and the dielectric board 3b targeted for measurement are measured based on a resonance frequency and a value Q at no load which are measured with the balanced-type circular disk resonator 10.

A temperature adjustment unit 6 is coupled to the conductive portion 2a and the conductive portion 2b of the balanced-type circular disk resonator 10 in order to adjust temperatures thereof. Various temperature adjustment elements and various temperature adjustment devices configured to adjust the temperatures of the conductive portion 2a and the conductive portion 2b by either heating or cooling or by heating and cooling the conductive portion 2a and the conductive portion 2b are used in the temperature adjustment unit 6. For example, a temperature adjustment element such as a Peltier element or a temperature adjustment device such as a hot plate is used in the temperature adjustment unit 6. The temperature adjustment unit 6 may use one or more temperature adjustment elements or use one or more temperature adjustment devices. The temperature adjustment unit 6 may adopt the temperature adjustment element only or the temperature adjustment device only. Alternatively, the temperature adjustment unit 6 may adopt both the temperature adjustment element and the temperature adjustment device. The temperature adjustment unit 6 may be coupled directly to the conductive portion 2a and the conductive portion 2b, or coupled indirectly to the conductive portion 2a and the conductive portion 2b through other conductive portions or conductive materials coupled to the conductive portion 2a and the conductive portion 2b.

In the case of using the Peltier elements as the temperature adjustment elements in the temperature adjustment unit 6, the Peltier elements may perform both heating and cooling of the conductive portion 2a and the conductive portion 2b. In the case of using the hot plates as the temperature adjustment devices in the temperature adjustment unit 6, the hot plates may perform heating of the conductive portion 2a and the conductive portion 2b.

In the balanced-type circular disk resonator 10 including the temperature adjustment unit 6 for adjusting the temperatures of the conductive portion 2a and the conductive portion 2b, the temperatures of the conductive portion 2a and the conductive portion 2b are adjusted by using the temperature adjustment unit 6 in the case of measuring the dielectric properties of the dielectric board 3a and the dielectric board 3b at the predetermined temperature. The temperatures of the conductive portion 2a and the conductive portion 2b are adjusted by using the temperature adjustment unit 6, and the temperatures of the dielectric board 3a and the dielectric board 3b are adjusted to the predetermined temperature, for example, a measurement temperature of the dielectric properties.

For this reason, the balanced-type circular disk resonator 10 does not have to be arranged in the above-described isothermal bath when measuring the dielectric properties of the dielectric board 3a and the dielectric board 3b at the predetermined temperature. Since the balanced-type circular disk resonator 10 is not arranged in the isothermal bath, it is possible to avoid the arrangement of (portions of) the excitation wires coupled to the balanced-type circular disk resonator 10 in the isothermal bath, the resultant heat deterioration of the excitation wires, and the occurrence of errors in the measurement of the dielectric properties due to the effect of the temperature dependencies of the excitation wires. According to the balanced-type circular disk resonator 10, it is possible to measure the dielectric properties of the dielectric board 3a and the dielectric board 3b at the predetermined temperature at high accuracy.

In the balanced-type circular disk resonator 10, the excitation wires coupled thereto are not arranged in the isothermal bath. Accordingly, the temperature dependencies of the excitation wires do not have to be acquired in advance or the temperature dependencies of the excitation wires do not have to be acquired in advance at each time the measurement takes place, and the measured values of the dielectric properties do not have to be corrected based on the obtained temperature dependencies of the excitation wires. According to the balanced-type circular disk resonator 10, it is possible to suppress an increase in the number of steps of measurement, complication associated therewith, and so forth.

In the balanced-type circular disk resonator 10, the temperatures of the conductive portion 2a and the conductive portion 2b are adjusted by using the temperature adjustment unit 6 coupled thereto, whereby the temperatures of the dielectric board 3a and the dielectric board 3b are adjusted. The use of the temperature adjustment unit 6 coupled to the conductive portion 2a and the conductive portion 2b makes it possible to adjust the temperatures of the dielectric board 3a and the dielectric board 3b quickly as compared to the case of using the isothermal bath as described above. In this way, it is possible to reduce measurement time for each measurement temperature of the dielectric properties of the dielectric board 3a and the dielectric board 3b, and to avoid prolonged measurement such as day-long work even in the case of carrying out the measurement at two or more measurement temperatures. According to the balanced-type circular disk resonator 10, it is possible to measure the dielectric properties of the dielectric board 3a and the dielectric board 3b at the predetermined temperature and at high accuracy while avoiding prolongation of the measurement.

As described above, according to the balanced-type circular disk resonator 10 of the first embodiment, it is possible to measure the dielectric properties of the dielectric board 3a and the dielectric board 3b at the predetermined temperature efficiently and at high accuracy.

The balanced-type circular disk resonator having the aforementioned configuration will be more specifically described below.

Second Embodiment

Figure 4A:
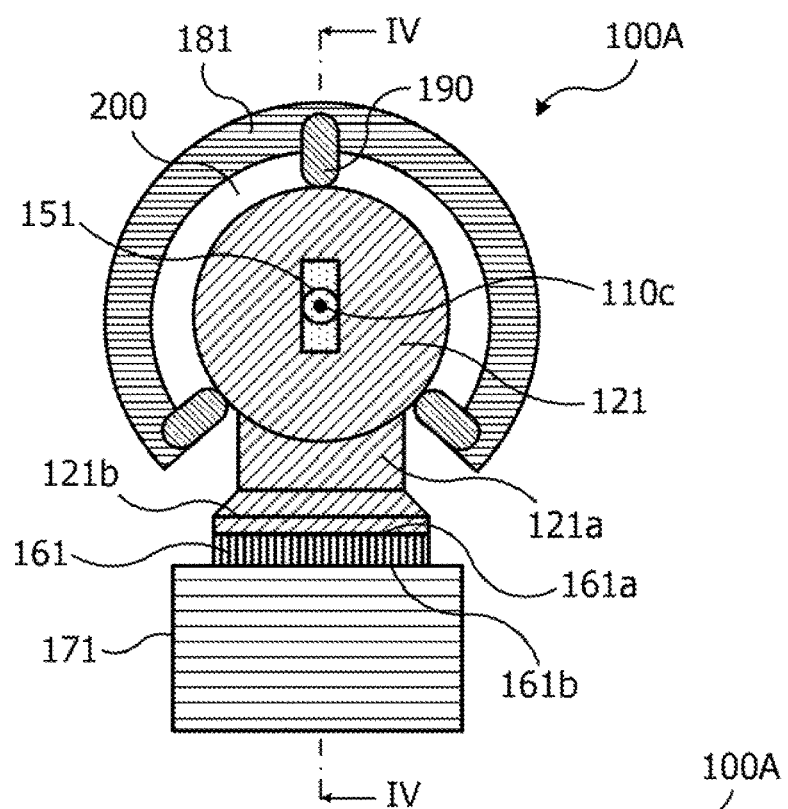
FIGS. 4A and 4B are diagrams for describing a first example of a balanced-type circular disk resonator according to a second embodiment.
Figure 4B:
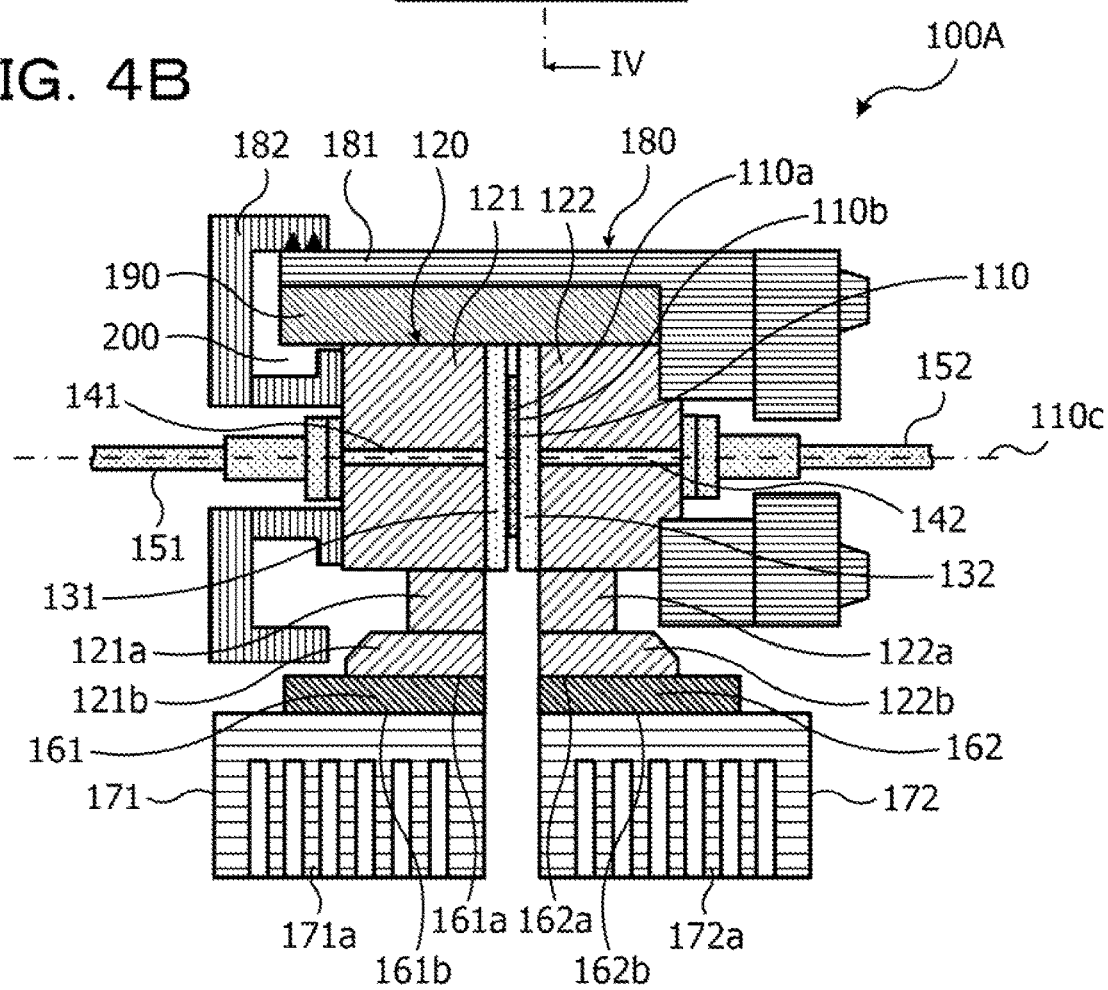

FIGS. 4A and 4B are diagrams for describing a first example of a balanced-type circular disk resonator according to a second embodiment. FIG. 4A schematically illustrates a plan view of a main part of the example of the balanced-type circular disk resonator. FIG. 4B schematically illustrates a cross-sectional view of the main part of the example of the balanced-type circular disk resonator. FIG. 4A represents a state of omitting the illustration of a certain element (a front casing to be described later) illustrated in FIG. 4B. FIG. 4B is a cross-sectional view of the main part corresponding to a cross-sectional plane along the IV-IV line in FIG. 4A.

A balanced-type circular disk resonator 100A illustrated in FIGS. 4A and 4B includes a circular conductive foil 110 and a conductive member 120. A circular copper foil is used for the circular conductive foil 110, for example. The conductive member 120 includes a conductive plate 121 provided on one surface 110a of the circular conductive foil 110 and a conductive plate 122 provided on another surface 110b of the circular conductive foil 110. A copper flat plate is used for each of the conductive plate 121 and the conductive plate 122, for example. A dielectric board 131 and a dielectric board 132 serving as samples targeted for measurement of the dielectric property are sandwiched between the circular conductive foil 110 and the conductive plate 121 as well as between the circular conductive foil 110 and the conductive plate 122, respectively. Dielectric flat plates having the same material quality and the same thickness are used for the dielectric board 131 and the dielectric board 132. The conductive plate 121 and the conductive plate 122 are provided with an excitation hole 141 and an excitation hole 142, respectively. The conductive plate 121 and the conductive plate 122 are provided such that the excitation hole 141 and the excitation hole 142 are located on a center axis 110c of the circular conductive foil 110.

The circular conductive foil 110 is one aspect of the circular conductive layer 1 described in the first embodiment. The conductive plate 121 and the conductive plate 122 are aspects of the conductive portion 2a and the conductive portion 2b described in the first embodiment. The dielectric board 131 and the dielectric board 132 are aspects of the dielectric board 3a and the dielectric board 3b described in the first embodiment. The excitation hole 141 and the excitation hole 142 are aspects of the excitation hole 4a and the excitation hole 4b described in the first embodiment.

An excitation wire 151 and an excitation wire 152 are coupled to positions of the excitation hole 141 of the conductive plate 121 and the excitation hole 142 of the conductive plate 122 of the balanced-type circular disk resonator 100A, respectively. A coaxial cable, for example, is used for each of the excitation wire 151 and the excitation wire 152. The excitation is brought about by electric field coupling by using the excitation wire 151 and the excitation wire 152 through the excitation hole 141 and the excitation hole 142 provided on the center axis 110c of the circular conductive foil 110. For example, a resonant electromagnetic wave inputted from the excitation wire 151 coupled to the one conductive plate 121 is outputted from the excitation wire 152 coupled to the other conductive plate 122. The relative permittivity and the dissipation factor of each of the dielectric board 131 and the dielectric board 132 targeted for measurement are measured based on a resonance frequency and a value Q at no load which are measured with the balanced-type circular disk resonator 100A.

Although FIGS. 4A and 4B illustrate a state where the excitation wire 151 and the excitation wire 152 are coupled to the balanced-type circular disk resonator 100A, the excitation wire 151 and the excitation wire 152 may be coupled at the time of measurement of the dielectric properties of the dielectric board 131 and the dielectric board 132.

The conductive member 120 of the balanced-type circular disk resonator 100A includes a coupling conductor 121a continuously coupled to the conductive plate 121 provided on the one surface 110a of the circular conductive foil 110 and a coupling conductor 121b continuously coupled to the coupling conductor 121a. The conductive member 120 further includes a coupling conductor 122a continuously coupled to the conductive plate 122 provided on the other surface 110b of the circular conductive foil 110 and a coupling conductor 122b continuously coupled to the coupling conductor 122a. A material with fine thermal conductivity such as copper is used for the coupling conductor 121a and the coupling conductor 121b as well as the coupling conductor 122a and the coupling conductor 122b. The coupling conductor 121a and the coupling conductor 121b may be integrated with the conductive plate 121, and the coupling conductor 122a and the coupling conductor 122b may be integrated with the conductive plate 122.

A Peltier element 161 and a Peltier element 162 are coupled to the conductive plate 121 and the conductive plate 122 of the balanced-type circular disk resonator 100A, respectively, as the temperature adjustment elements for adjusting the temperatures thereof. In this example, one surface 161a of the Peltier element 161 is coupled to the coupling conductor 121b that is coupled to the conductive plate 121 through the coupling conductor 121a, whereby the conductive plate 121 is thermally coupled to the Peltier element 161. Likewise, one surface 162a of the Peltier element 162 is coupled to the coupling conductor 122b that is coupled to the conductive plate 122 through the coupling conductor 122a, whereby the conductive plate 122 is thermally coupled to the Peltier element 162.

Each of the Peltier element 161 and the Peltier element 162 is an aspect of the temperature adjustment unit 6 or the temperature adjustment element used in the temperature adjustment unit 6 discussed in the above-described first embodiment.

Each of the coupling conductor 121a and the coupling conductor 121b interposed between the conductive plate 121 and the Peltier element 161 adopts a shape designed for thermal conduction between the conductive plate 121 and the Peltier element 161. For example, each coupling conductor adopts such a shape that either extends straight or spreads in an inclined manner from the conductive plate 121 toward the Peltier element 161 or such a shape that either contracts in an inclined manner or extends straight from the Peltier element 161 toward the conductive plate 121. Likewise, each of the coupling conductor 122a and the coupling conductor 122b interposed between the conductive plate 122 and the Peltier element 162 adopts a shape designed for thermal conduction between the conductive plate 122 and the Peltier element 162. For example, each coupling conductor adopts such a shape that either extends straight or spreads in an inclined manner from the conductive plate 122 toward the Peltier element 162 or such a shape that either contracts in an inclined manner or extends straight from the Peltier element 162 toward the conductive plate 122.

A heatsink 171 is coupled to another surface 161b of the Peltier element 161 of the balanced-type circular disk resonator 100A, which is located opposite to the one surface 161a to which the coupling conductor 121b is coupled. Likewise, a heatsink 172 is coupled to another surface 162b of the Peltier element 162, which is located opposite to the one surface 162a to which the coupling conductor 122b is coupled. An air-cooled heatsink 171 provided with fins 171a and an air cooled heatsink 172 provided with fins 172a are illustrated as examples herein. The heatsink 171 and the heatsink 172 have functions to enhance heat dissipation efficiency on the surface 161b and the surface 162b of the Peltier element 161 and the Peltier element 162 in the case where the temperatures of the surface 161b and the surface 162b opposite to the coupling conductor 121b and the coupling conductor 122b are set to high temperatures. The heatsink 171 and the heatsink 172 also have functions to suppress rises in temperature on the surface 161b and the surface 162b of the Peltier element 161 and the Peltier element 162 in the case where the temperatures of the surface 161b and the surface 162b opposite to the coupling conductor 121b and the coupling conductor 122b are set to low temperatures.

A casing 180 is provided outside of the conductive plate 121 and the conductive plate 122 that sandwich the circular conductive foil 110 as well as the dielectric board 131 and the dielectric board 132 of the balanced-type circular disk resonator 100A. The casing 180 includes a rear casing 181 and a front casing 182. FIG. 4A illustrates a state of detaching the front casing 182 for the sake of convenience. The rear casing 181 is formed into such a shape that partially surrounds the conductive plate 121 and the conductive plate 122. Various materials including a metal such as stainless steel, a heat resistant resin such as epoxy resin, and a ceramic may be used for the rear casing 181 and the front casing 182.

Multiple (three in this example) pins 190 are provided between the rear casing 181 and the conductive plate 121 and between the rear casing 181 and the conductive plate 122 of the balanced-type circular disk resonator 100A while being in contact therewith. A space is defined between the rear casing 181 and the conductive plate 121 and between the rear casing 181 and the conductive plate 122 as a result of interposing the pins 190 between the rear casing 181 and the conductive plate 121 and between the rear casing 181 and the conductive plate 122. In the balanced-type circular disk resonator 100A, an air layer 200 which is the space defined between the rear casing 181 and the conductive plate 121 and between the rear casing 181 and the conductive plate 122 functions as a heat insulation layer that suppresses the thermal conduction between the rear casing 181 and the conductive plate 121 and between the rear casing 181 and the conductive plate 122.

For example, a rod-like member having a length extending across the conductive plate 121 and the conductive plate 122 as illustrated in FIG. 4B is used for each pin 190. Various materials including a metal such as stainless steel, a heat resistant resin such as epoxy resin, and a ceramic may be used for the pins 190. The pins 190 are attached to the rear casing 181 in advance, for example, and brought into contact with the conductive plate 121 and the conductive plate 122 by putting the rear casing 181 over the outside of the conductive plate 121 and the conductive plate 122 that sandwich the circular conductive foil 110 as well as the dielectric board 131 and the dielectric board 132. Each pin 190 is formed into an oval shape (FIG. 4A) or an elliptic shape in front view, for example, from the viewpoint of suppressing the thermal conduction between the rear casing 181 and the conductive plate 121 and between the rear casing 181 and the conductive plate 122, whereby a contact area with each of the conductive plate 121 and the conductive plate 122 is reduced.

The measurement of the dielectric properties by using the balanced-type circular disk resonator 100A having the aforementioned configuration will now be described.

Figure 5:
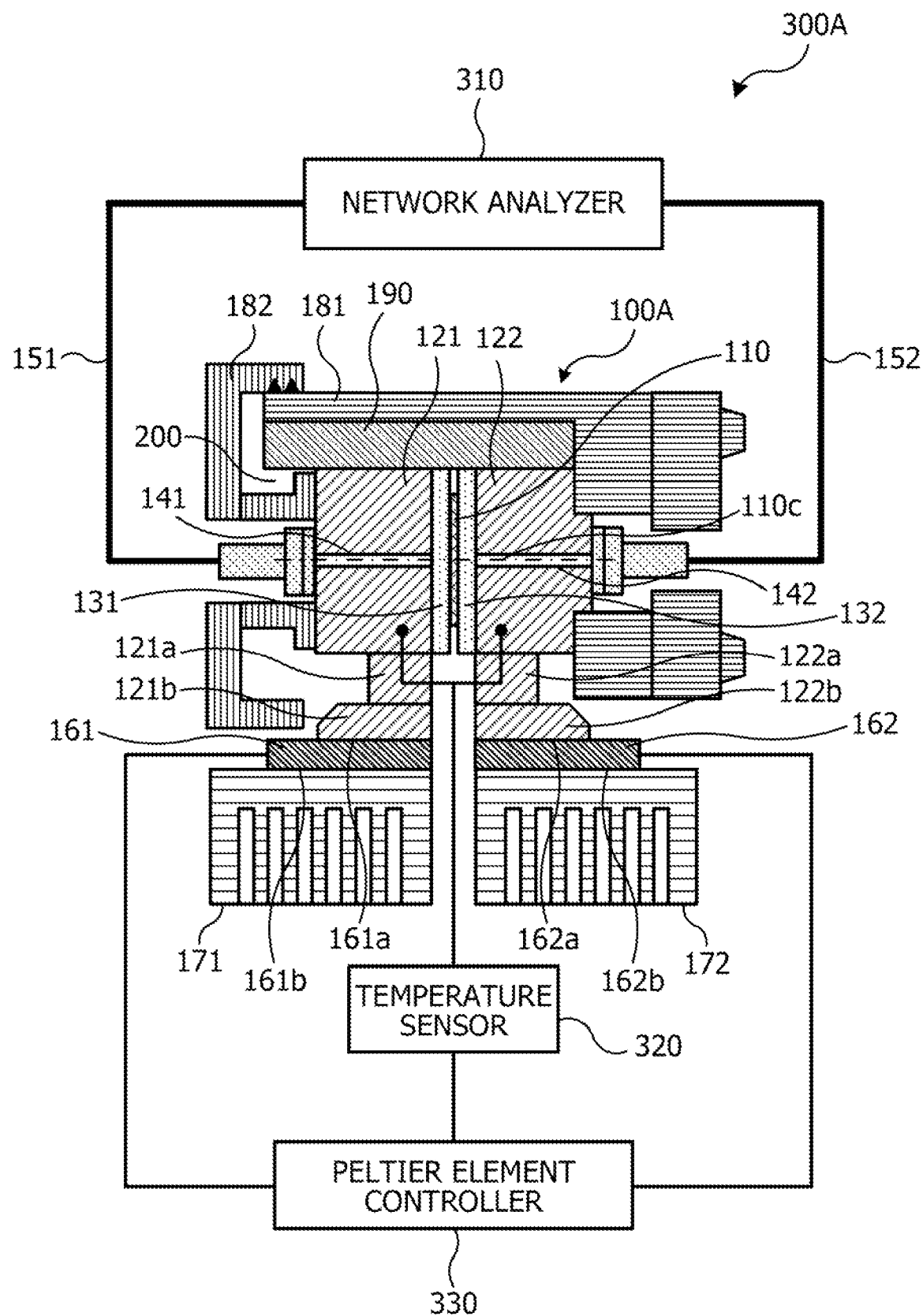
FIG. 5 is a diagram for describing an example of a dielectric property measurement system using the balanced-type circular disk resonator according to the second embodiment.

FIG. 5 is a diagram for describing an example of a dielectric property measurement system using the balanced-type circular disk resonator according to the second embodiment.

A dielectric property measurement system 300A illustrated in FIG. 5 includes the balanced-type circular disk resonator 100A, a network analyzer 310, a temperature sensor 320, and a Peltier element controller 330.

The balanced-type circular disk resonator 100A is coupled to the network analyzer 310 by using the excitation wire 151 and the excitation wire 152 each adopting the coaxial cable. The excitation wire 151 is coupled to the position of the excitation hole 141 provided to the one conductive plate 121 of the balanced-type circular disk resonator 100A while the excitation wire 152 is coupled to the position of the excitation hole 142 provided to the other conductive plate 122 thereof.

For example, an electromagnetic wave outputted from the network analyzer 310 is inputted to the balanced-type circular disk resonator 100A through the excitation wire 151. In the balanced-type circular disk resonator 100A, resonance corresponding to the dielectric property of the dielectric board 131 occurs between the conductive plate 121 and the circular conductive foil 110. The electromagnetic wave leaks out and causes resonance corresponding to the dielectric property of the dielectric board 132 between the circular conductive foil 110 and the conductive plate 122. This electromagnetic wave is then inputted to the network analyzer 310 through the excitation wire 152. A resonance waveform is obtained by using the output of the electromagnetic wave in a predetermined frequency range using the network analyzer 310 to the balanced-type circular disk resonator 100A and using the input from the balanced-type circular disk resonator 100A to the network analyzer 310 corresponding thereto and the resonance frequency and the value Q at no load are thus measured. The relative permittivity and the dissipation factor of each of the dielectric board 131 and the dielectric board 132 targeted for measurement are measured based on the resonance frequency and the value Q at no load thus measured.

The temperature sensor 320 of the dielectric property measurement system 300A detects temperatures of the conductive plate 121 and the conductive plate 122. The temperature sensor 320 may detect temperatures of the coupling conductor 121a or the coupling conductor 121b coupled to the conductive plate 121 and of the coupling conductor 122a or the coupling conductor 122b coupled to the conductive plate 122 as the temperatures of the conductive plate 121 and the conductive plate 122. A thermoelectric couple or the like is used for the temperature sensor 320. A non-contact sensor may be used for the temperature sensor 320.

The Peltier element controller 330 of the dielectric property measurement system 300A controls the magnitude and the polarity of a direct current to be applied to each of the Peltier element 161 and the Peltier element 162 based on the temperatures of the conductive plate 121 and the conductive plate 122 detected by the temperature sensor 320.

In the dielectric property measurement system 300A, the measurement of the dielectric properties of the dielectric board 131 and the dielectric board 132 is carried out at a predetermined measurement temperature. In this case, in the dielectric property measurement system 300A, the temperature sensor 320 detects the temperatures of the conductive plate 121 and the conductive plate 122, and the Peltier element controller 330 controls the direct current to be applied to the Peltier element 161 and the Peltier element 162 based on the detected temperatures.

In the Peltier element 161 and the Peltier element 152, heat generation occurs on the coupling conductor 121b and the coupling conductor 122b while heat absorption occurs on the heatsink 171 and the heatsink 172 based on the direct current applied by the Peltier element controller 330, for example. Alternatively, in the Peltier element 161 and the Peltier element 162, heat absorption occurs on the coupling conductor 121b and the coupling conductor 122b while heat generation occurs on the heatsink 171 and the heatsink 172 based on the direct current applied by the Peltier element controller 330.

In the case of heating the conductive plate 121 and the conductive plate 122, the Peltier element controller 330 controls the Peltier element 161 and the Peltier element 162 in such a way as to bring about the heat generation on the surface 161a and the surface 162a on the coupling conductor 121b and the coupling conductor 122b. The heatsink 171 and the heatsink 172 contribute to cooling of the surface 161b and the surface 162b on the heatsink 171 and the heatsink 172 where the heat absorption of the Peltier element 161 and the Peltier element 162 takes place.

In the case of cooling the conductive plate 121 and the conductive plate 122, the Peltier element controller 330 controls the Peltier element 161 and the Peltier element 162 in such a way as to bring about the heat absorption on the surface 161a and the surface 162a on the coupling conductor 121b and the coupling conductor 122b. The heatsink 171 and the heatsink 172 contribute to cooling of the surface 161b and the surface 162b of the Peltier element 161 and the Peltier element 162 on the heatsink 171 and the heatsink 172 where the heat generation takes place.

As described above, in the dielectric property measurement system 300A, the temperatures of the conductive plate 121 and the conductive plate 122 are detected by the temperature sensor 320. Based on the temperatures detected by the temperature sensor 320, the Peltier element 161 and the Peltier element 162 are controlled by the Peltier element controller 330. Accordingly, the heat transfers to the conductive plate 121 and the conductive plate 122 or from the conductive plate 121 and the conductive plate 122 through the coupling conductor 121a and the coupling conductor 121b as well as the coupling conductor 122a and the coupling conductor 122b, and the temperatures of the conductive plate 121 and the conductive plate 122 are thus adjusted. As a consequence of the control of the Peltier element 161 and the Peltier element 162 by the Peltier element controller 330, the temperatures of the conductive plate 121 and the conductive plate 122 are adjusted whereby the dielectric board 131 and the dielectric board 132 are adjusted to the predetermined measurement temperature. For example, the use of the Peltier element 161 and the Peltier element 162 makes it possible to adjust the temperatures of the conductive plate 121 and the conductive plate 122 as well as the temperatures of the dielectric board 131 and the dielectric board 132 in a temperature range from −55° C. to 150° C. or even in a wider temperature range from −100° C. to 200° C. In the dielectric property measurement system 300A, the dielectric board 131 and the dielectric board 132 are thus adjusted to the predetermined measurement temperature and are subjected to the measurement of the dielectric properties as described above.

In the dielectric property measurement system 300A, the dielectric board 131 and the dielectric board 132 are adjusted to the predetermined measurement temperature by using the temperature sensor 320 and the Peltier element controller 330. Accordingly, the balanced-type circular disk resonator 100A does not have to be arranged in the isothermal bath at the time of measurement of the dielectric properties. Since the balanced-type circular disk resonator 100A is not arranged in the isothermal bath, the excitation wire 151 and the excitation wire 152 (or portions thereof) coupled to the balanced-type circular disk resonator 100A are kept from being arranged in the isothermal bath. This configuration suppresses deterioration of the excitation wire 151 and the excitation wire 152 by heat, and the occurrence of errors in the measurement of the dielectric properties due to effects of the temperature dependencies of the excitation wire 151 and the excitation wire 152. According to the balanced-type circular disk resonator 100A and the dielectric property measurement system 300A using the same, it is possible to measure the dielectric properties of the dielectric board 131 and the dielectric board 132 at the predetermined measurement temperature at high accuracy.

In the balanced-type circular disk resonator 100A, the excitation wire 151 and the excitation wire 152 coupled thereto are not arranged in the isothermal bath. Accordingly, the temperature dependencies of the excitation wire 151 and the excitation wire 152 do not have to be acquired in advance or acquired in advance at each time the measurement takes place. The measured values of the dielectric properties do not have to be corrected based on the temperature dependencies of the excitation wire 151 and the excitation wire 152 thus obtained. According to the balanced-type circular disk resonator 100A and the dielectric property measurement system 300A using the same, it is possible to suppress an increase in the number of steps of measurement, complication associated therewith, and so forth.

In the balanced-type circular disk resonator 100A, the temperatures of the conductive plate 121 and the conductive plate 122 are adjusted by using the Peltier element 161 and the Peltier element 162, whereby the temperatures of the dielectric board 131 and the dielectric board 132 are adjusted. The use of the Peltier element 161 and the Peltier element 162 makes it possible to adjust the temperatures of the dielectric board 131 and the dielectric board 132 quickly as compared to the case of using the isothermal bath. In this way, it is possible to reduce measurement time for each measurement temperature of the dielectric properties of the dielectric board 131 and the dielectric board 132, and to avoid prolonged measurement such as day-long work even in the case of carrying out the measurement at two or more measurement temperatures. In the case of using the isothermal bath, for example, measurement time of about 30 minutes is taken for each measurement temperature. On the other hand, the balanced-type circular disk resonator 100A takes measurement time of just about 3 minutes for each measurement temperature. This reduces the measurement time approximately to one-tenth. According to the balanced-type circular disk resonator 100A and the dielectric property measurement system 300A using the same, it is possible to measure the dielectric properties of the dielectric board 131 and the dielectric board 132 at the predetermined measurement temperature in relatively a short time.

According to the balanced-type circular disk resonator 100A and the dielectric property measurement system 300A using the same, it is possible to measure the dielectric properties of the dielectric board 131 and the dielectric board 132 at the predetermined measurement temperature efficiently and at high accuracy.

In the balanced-type circular disk resonator 100A, the pins 190 are interposed between the rear casing 181 and the conductive plate 121 and between the rear casing 181 and the conductive plate 122 so as to form the heat insulation layer such as the air layer 200. Accordingly, it is possible to diminish the effect of a temperature outside the balanced-type circular disk resonator 100A on the temperatures of the conductive plate 121 and the conductive plate 122. This makes it possible to carry out the adjustment of the temperatures of the conductive plate 121 and the conductive plate 122 by using the Peltier element 161 and the Peltier element 162 and thus to adjust the temperatures of the dielectric board 131 and the dielectric board 132 at high accuracy.

The pins 190 are attached to the rear casing 181 in advance, for example, and brought into contact with the conductive plate 121 and the conductive plate 122 by putting the rear casing 181 over the outside of the conductive plate 121 and the conductive plate 122. As a consequence of putting the rear casing 181 so as to bring the pins 190 into contact with the conductive plate 121 and the conductive plate 122, the space (the heat insulation layer) in the size corresponding to a height of the pins 190 from the rear casing 181 is formed between the rear casing 181 and the conductive plate 121 and between the rear casing 181 and the conductive plate 122. The position of the rear casing 181 is also aligned with the conductive plate 121 and the conductive plate 122 by using the pins 190 having the prescribed height from the rear casing 181. Provision of the pins 190 makes it possible to achieve heat insulation of the balanced-type circular disk resonator 100A, and to improve efficiency and simplification of assembly work thereof.

In the balanced-type circular disk resonator 100A, the coupling conductor 121a and the coupling conductor 121b as well as the coupling conductor 122a and the coupling conductor 122b are provided at positions displaced from the center axis 110c of the circular conductive foil 110, for example, on side surfaces of the conductive plate 121 and the conductive plate 122. The Peltier element 161 and the Peltier element 162 are then coupled to the coupling conductor 121b and the coupling conductor 122b. As described above, in the balanced-type circular disk resonator 100A, elements for temperature adjustment are coupled to and arranged at the side surfaces of the conductive plate 121 and the conductive plate 122 without changing their shapes. This makes it possible to achieve the temperature adjustment while suppressing degradation of axial alignment: accuracy of the conductive plate 121 and the conductive plate 122 (as well as the excitation hole 141 and the excitation hole 142 thereof) relative to the center axis 110c of the circular conductive foil 110 and the occurrence of undesirable resonance.

Figure 6A:
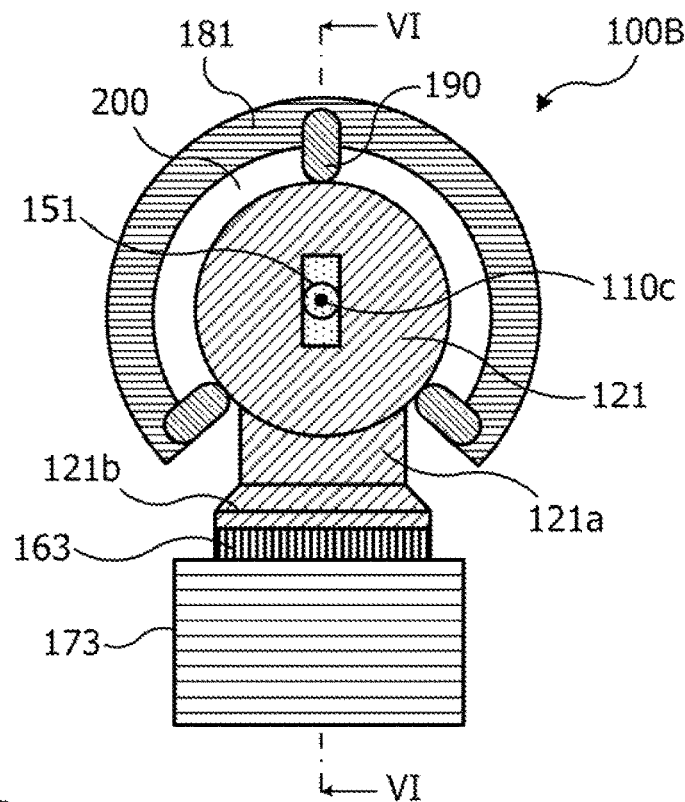
FIGS. 6A and 6B are diagrams for describing a second example of the balanced-type circular disk resonator according to the second embodiment.
Figure 6B:
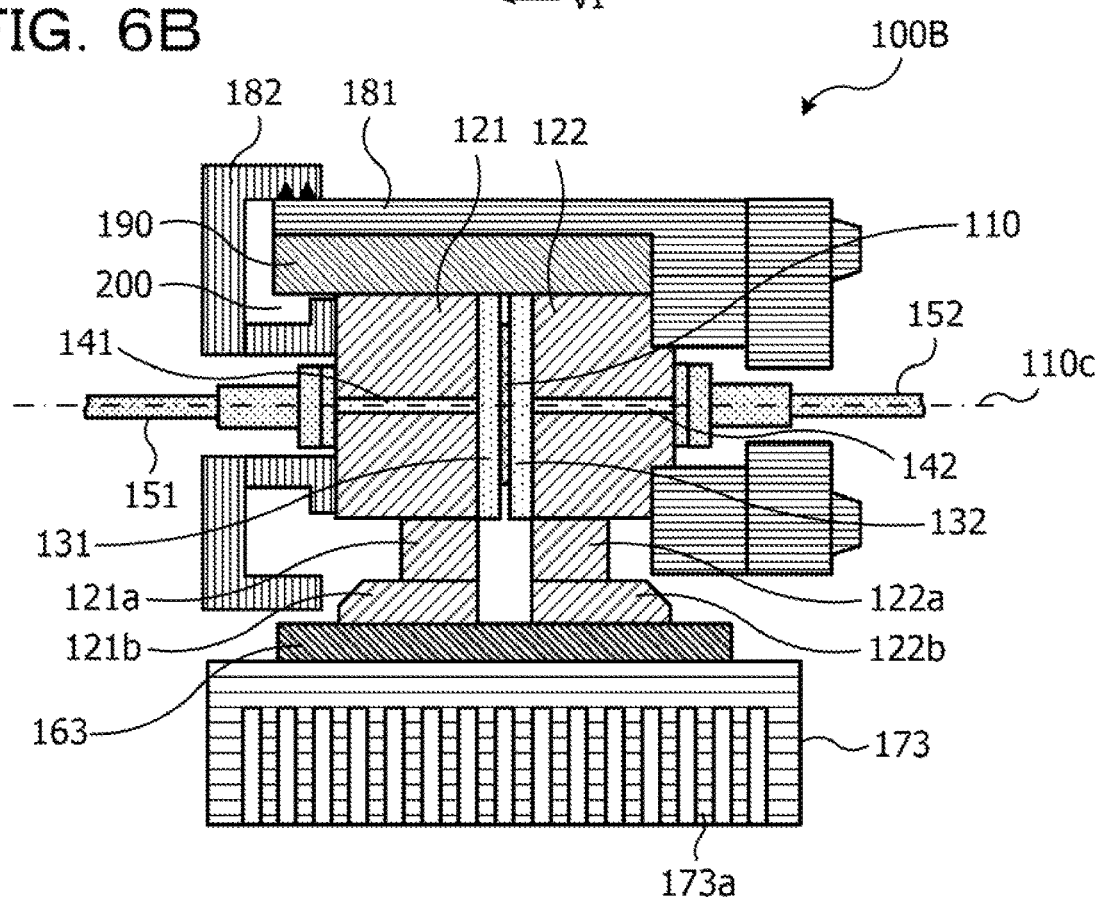

FIGS. 6A and 6B are diagrams for describing a second example of the balanced-type circular disk resonator according to the second embodiment, FIG. 6A schematically illustrates a plan view of a main part of the example of the balanced-type circular disk resonator. FIG. 6B schematically illustrates a cross-sectional view of the main part of the example of the balanced-type circular disk resonator. FIG. 6A represents a state of omitting the illustration of a certain element (a front casing to be described later) illustrated in FIG. 6B. FIG. 6B is a cross-sectional view of the main part corresponding to a cross-sectional plane along the VI-VI line in FIG. 6A.

In a balanced-type circular disk resonator 100B illustrated in FIGS. 6A and 6B, a shared Peltier element 163 is coupled to the coupling conductor 121b that is coupled to the conductive plate 121 through the coupling conductor 121a and to the coupling conductor 122b that is coupled to the conductive plate 122 through the coupling conductor 122a. A heatsink 173 provided with fins 173a is coupled to the Peltier element 163. In view of the features mentioned above, the balanced-type circular disk resonator 100B is different from the balanced-type circular disk resonator 100A (FIGS. 4A and 4B) discussed in the above-described first example, for example, the balanced-type circular disk resonator 100A in which the Peltier element 161 and the Peltier element 162 are coupled to the coupling conductor 121b and the coupling conductor 122b, respectively. In the balanced-type circular disk resonator 100B, the conductive plate 121 and the conductive plate 122 are heated or cooled by using the Peltier element 163 (and the heatsink 173), whereby the temperatures of the conductive plate 121 and the conductive plate 122 are adjusted and the temperatures of the dielectric board 131 and the dielectric board 132 are adjusted accordingly.

For example, a dielectric property measurement system using the balanced-type circular disk resonator 100B is realized in accordance with the above-described example of the dielectric property measurement system 300A (FIG. 5). In the dielectric property measurement system using the balanced-type circular disk resonator 100B, a network analyzer is coupled to the balanced-type circular disk resonator 100B by using the excitation wire 151 and the excitation wire 152. The dielectric property measurement system using the balanced-type circular disk resonator 100B is provided with a temperature sensor that detects the temperatures of the conductive plate 121 and the conductive plate 122, and a Peltier element controller that controls the Peltier element 163 based on the temperatures detected by the temperature sensor. In the dielectric property measurement system using the balanced-type circular disk resonator 100B, as a consequence of the control of the Peltier element 163 by the Peltier element controller, the temperatures of the conductive plate 121 and the conductive plate 122 are adjusted whereby the dielectric board 131 and the dielectric board 132 are adjusted to the predetermined measurement temperature. The dielectric board 131 and the dielectric board 132 are adjusted to the predetermined measurement temperature and are subjected to the measurement of the dielectric properties by using the network analyzer as well as the excitation wire 151 and the excitation wire 152.

The balanced-type circular disk resonator 100B as illustrated in FIGS. 6A and 6B and the dielectric property measurement system using the same also make it possible to measure the dielectric properties of the dielectric board 131 and the dielectric board 132 at the predetermined measurement temperature efficiently and at high accuracy.

Figure 7A:
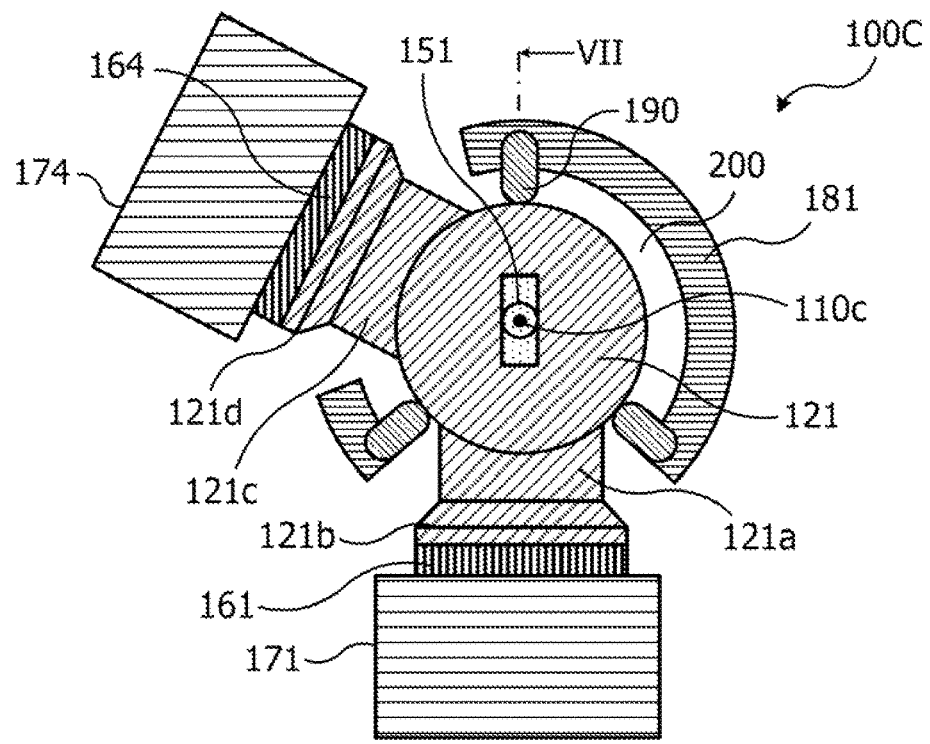
FIGS. 7A and 7B are diagrams for describing a third example of the balanced-type circular disk resonator according to the second embodiment.
Figure 7B:
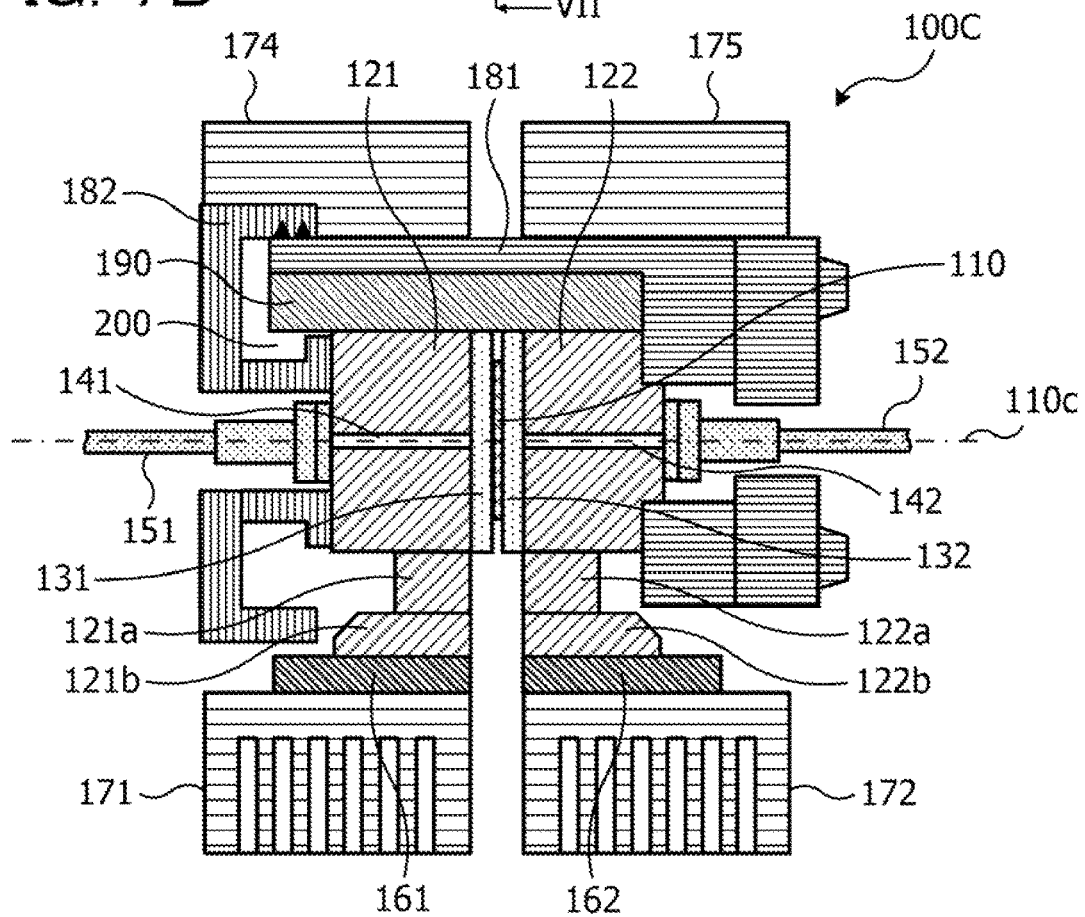

FIGS. 7A and 7B are diagrams for describing a third example of the balanced-type circular disk resonator according to the second embodiment. FIG. 7A schematically illustrates a plan view of a main part of the example of the balanced-type circular disk resonator. FIG. 7B schematically illustrates a cross-sectional view of the main part of the example of the balanced-type circular disk resonator. FIG. 7A represents a state of omitting the illustration of a certain element (a front casing to be described later) illustrated in FIG. 7B. FIG. 7B is a cross-sectional view of the main part corresponding to a cross-sectional plane along the VII-VII line in FIG. 7A.

In a balanced-type circular disk resonator 100C illustrated in FIGS. 7A and 7B, the conductive plate 121 is further provided with a coupling conductor 121c continuously coupled to the conductive plate 121 and a coupling conductor 121d continuously coupled thereto in addition to the coupling conductor 121a and the coupling conductor 121b. In the balanced-type circular disk resonator 100C, a Peltier element 164 is coupled to the coupling conductor 121d and a heatsink 174 is coupled to the Peltier element 164. Moreover, in the balanced-type circular disk resonator 100C, the conductive plate 122 is further provided with another coupling conductor (not illustrated) continuously coupled to the conductive plate 122 in addition to the coupling conductor 122a and the coupling conductor 122b. Another Peltier element (not illustrated) is coupled to the additional coupling conductor and a heatsink 175 is coupled to the additional Peltier element. In view of the features mentioned above, the balanced-type circular disk resonator 100C is different from the balanced-type circular disk resonator 100A (FIGS. 4A and 4B) discussed in the above-described first example.

In the balanced-type circular disk resonator 100C, the Peltier element 161 coupled to the conductive plate 121 through the coupling conductor 121a and the coupling conductor 121b and the Peltier element 164 coupled to the conductive plate 121 through the coupling conductor 121c and the coupling conductor 121d may be of the same type or of different types from each other. The Peltier element 162 coupled to the conductive plate 122 through the coupling conductor 122a and the coupling conductor 122b and the additional Peltier element coupled to the conductive plate 122 through the additional coupling conductor may be of the same type or of different types from each other.

As described above, In the balanced-type circular disk resonator 100C, the Peltier element 161 is coupled to the conductive plate 121 through the coupling conductor 121a and the coupling conductor 121b and the Peltier element 164 is coupled to the conductive plate 121 through the coupling conductor 121c and the coupling conductor 121d. The Peltier element 162 is coupled to the conductive plate 122 through the coupling conductor 122a and the coupling conductor 122b, and the additional Peltier element is coupled thereto through the additional coupling conductor. In the balanced-type circular disk resonator 100C, the conductive plate 121 and the conductive plate 122 are heated or cooled by using the Peltier element 161, the Peltier element 162, the Peltier element 164, and the like, whereby the temperatures of the conductive plate 121 and the conductive plate 122 as well as the temperatures of the dielectric board 131 and the dielectric board 132 are adjusted.

For example, a dielectric property measurement system using the balanced-type circular disk resonator 100C is realized in accordance with the above-described example of the dielectric property measurement system 300A (FIG. 5). In the dielectric property measurement system using the balanced-type circular disk resonator 100C, a network analyzer is coupled to the balanced-type circular disk resonator 100C by using the excitation wire 151 and the excitation wire 152. The dielectric property measurement system is further provided with a temperature sensor that detects the temperatures of the conductive plate 121 and the conductive plate 122, and a Peltier element controller that controls the Peltier element 161, the Peltier element 162, the Peltier element 164, and the like based on the temperatures detected by the temperature sensor. In the dielectric property measurement system, as a consequence of the control of the Peltier element 161, the Peltier element 162, the Peltier element 164, and the like by the Peltier element controller, the temperatures of the conductive plate 121 and the conductive plate 122 are adjusted and the dielectric board 131, whereby the dielectric board 132 are adjusted to the predetermined measurement temperature. The dielectric board 131 and the dielectric board 132 are adjusted to the predetermined measurement temperature and are subjected to the measurement of the dielectric properties by using the network analyzer as well as the excitation wire 151 and the excitation wire 152.

The balanced-type circular disk resonator 100C as illustrated in FIGS. 7A and 7B and the dielectric property measurement system using the same also make it possible to measure the dielectric properties of the dielectric board 131 and the dielectric board 132 at the predetermined measurement temperature efficiently and at high accuracy.

In the balanced-type circular disk resonator 100C, the two of Peltier element 161 and the Peltier element 164 are coupled to different positions of the single conductive plate 121 while the Peltier element 162 and the additional Peltier element are coupled to different positions of the single conductive plate 122. This makes it possible to adjust the temperatures of the conductive plate 121 and the conductive plate 122 quickly and uniformly, and thus to adjust the dielectric board 131 and the dielectric board 132 to the predetermined measurement temperature quickly and uniformly.

The number of the Peltier elements coupled to the single conductive plate 121 is not limited to two, and a structure to couple three or more Peltier elements to the single conductive plate 121 may be adopted instead. Likewise, the number of the Peltier elements coupled to the single conductive plate 122 is not limited to two, and a structure to couple three or more Peltier elements to the single conductive plate 122 may be adopted instead. The number of the Peltier elements to be coupled to the single conductive plate 121 and the number of the Peltier elements to be coupled to the single conductive plate 122 may be equal to or different from each other. It is also possible to provide the conductive plate 121 and the conductive plate 122 of the balanced-type circular disk resonator 100B (see FIGS. 6A and 6B) discussed in the second example with one or more additional Peltier elements in accordance with the third example.

Figure 8A:
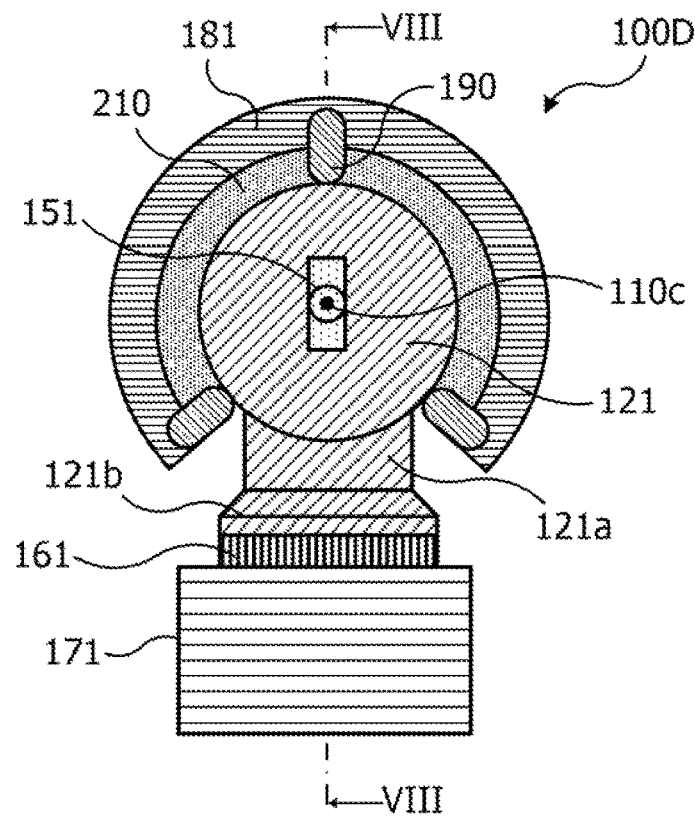
FIGS. 8A and 8B are diagrams for describing a fourth example of the balanced-type circular disk resonator according to the second embodiment.
Figure 8B:
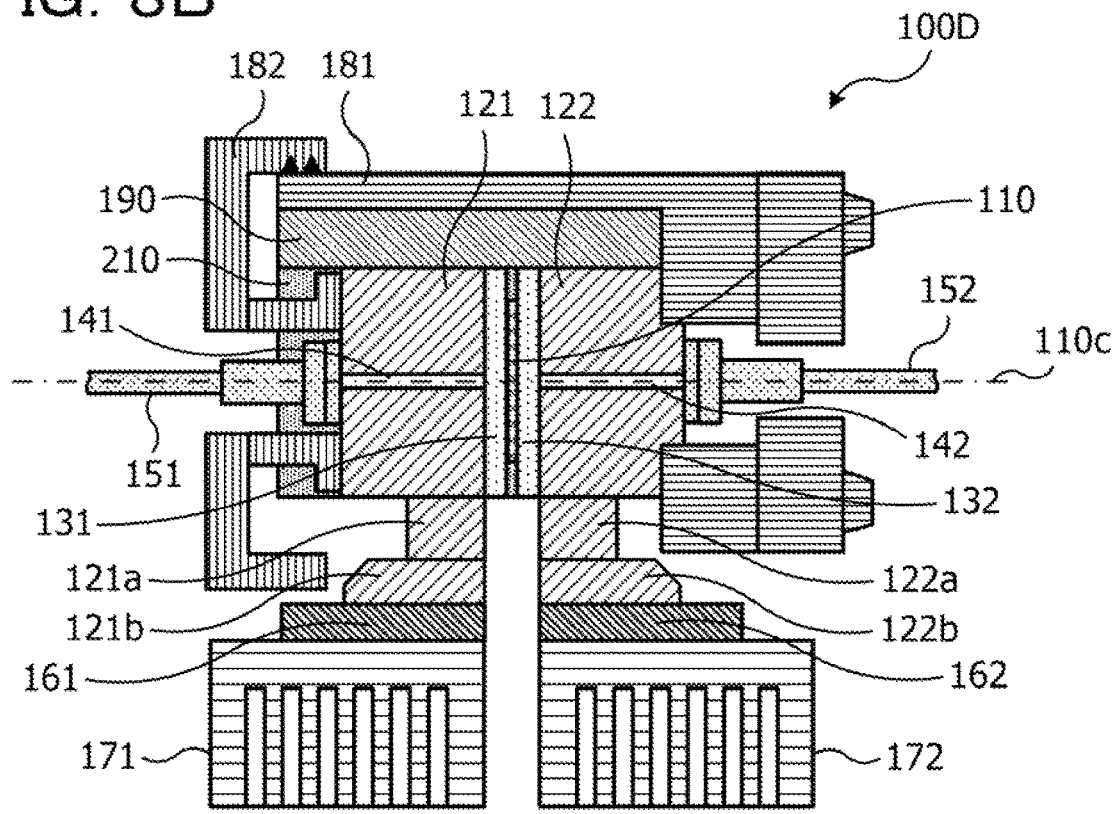

FIGS. 8A and 8B are diagrams for describing a fourth example of the balanced-type circular disk resonator according to the second embodiment. FIG. 8A schematically illustrates a plan view of a main part of the example of the balanced-type circular disk resonator. FIG. 8B schematically illustrates a cross-sectional view of the main part of the example of the balanced-type circular disk resonator. FIG. 8A represents a state of omitting the illustration of a certain element (a front casing to be described later) illustrated in FIG. 8B. FIG. 8B is a cross-sectional view of the main part corresponding to a cross-sectional plane along the VIII-VIII line in FIG. 8A.

In a balanced-type circular disk resonator 100D illustrated in FIGS. 8A and 8B, a heat insulation material 210 is provided in the space defined between the rear casing 181 and the conductive plate 121 and between the rear casing 181 and the conductive plate 122. In view of the feature mentioned above, the balanced-type circular disk resonator 100D is different from the balanced-type circular disk resonator 100A (FIGS. 4A and 4B) discussed in the above-described first example. In the balanced-type circular disk resonator 100D, the heat insulation material 210 functions as the heat insulation layer that suppresses the thermal conduction between the rear casing 181 and the conductive plate 121 and between the rear casing 181 and the conductive plate 122. For example, the heat insulation material 210 may use a foam-based heat insulation material such as polystyrene foam (foamed styrol), urethane foam, and phenolic foam, or a fiber-based heat insulation material such as glass wool, rock wool, and cellulose fiber.

For example, a dielectric property measurement system using the balanced-type circular disk resonator 100D is realized in accordance with the above-described example of the dielectric property measurement system 300A (FIG. 5). In the dielectric property measurement system using the balanced-type circular disk resonator 100D, a network analyzer is coupled to the balanced-type circular disk resonator 100D by using the excitation wire 151 and the excitation wire 152. The dielectric property measurement system is further provided with the temperature sensor that detects the temperatures of the conductive plate 121 and the conductive plate 122, and the Peltier element controller that controls the Peltier element 161 and the Peltier element 162 based on the temperatures detected by the temperature sensor. In the dielectric property measurement system, as a consequence of the control of the Peltier element 161 and the Pettier element 162 by the Peltier element controller, the temperatures of the conductive plate 121 and the conductive plate 122 are adjusted whereby the dielectric board 131 and the dielectric board 132 are adjusted to the predetermined measurement temperature. The dielectric board 131 and the dielectric board 132 are adjusted to the predetermined measurement temperature and are subjected to the measurement of the dielectric properties by using the network analyzer as well as the excitation wire 151 and the excitation wire 152.

In the balanced-type circular disk resonator 100D, the heat insulation material 210 is provided on an outer side of the conductive plate 121 and the conductive plate 122. Accordingly, it is possible to diminish the effect of the temperature outside the balanced-type circular disk resonator 100D on the temperatures of the conductive plate 121 and the conductive plate 122. This makes it possible to carry out the adjustment of the temperatures of the conductive plate 121 and the conductive plate 122 by using the Peltier element 161 and the Peltier element 162 and thus to adjust the temperatures of the dielectric board 131 and the dielectric board 132 at high accuracy.

The balanced-type circular disk resonator 100D as illustrated in FIGS. 8A and 8B and the dielectric property measurement system using the same also make it possible to measure the dielectric properties of the dielectric board 131 and the dielectric board 132 at the predetermined measurement temperature efficiently and at high accuracy.

The heat insulation material 210 described in the fourth example is also applicable to the balanced-type circular disk resonator 100B (FIGS. 6A and 6B) described in the second example and to the balanced-type circular disk resonator 100C (FIGS. 7A and 7B) described in the third example.

Third Embodiment

Figure 9A:
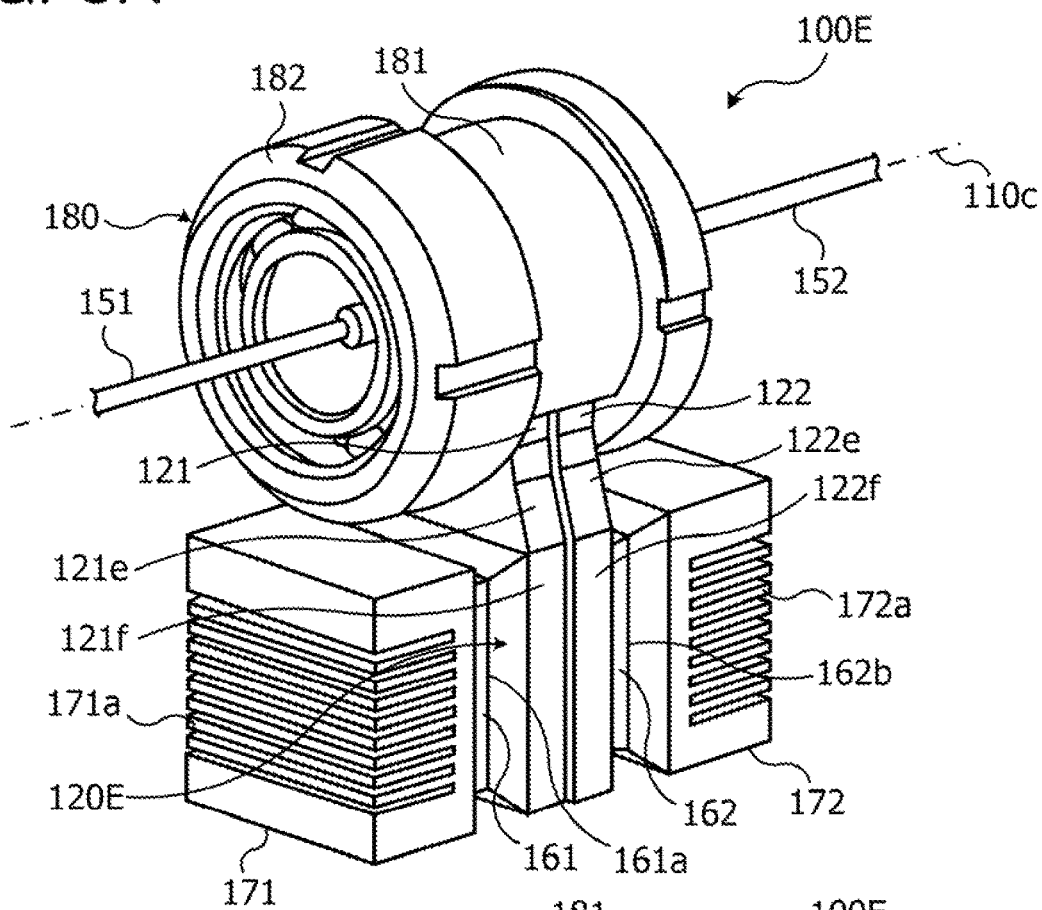
FIGS. 9A and 9B are first diagrams for describing an example of a balanced-type circular disk resonator according to a third embodiment.
Figure 9B:
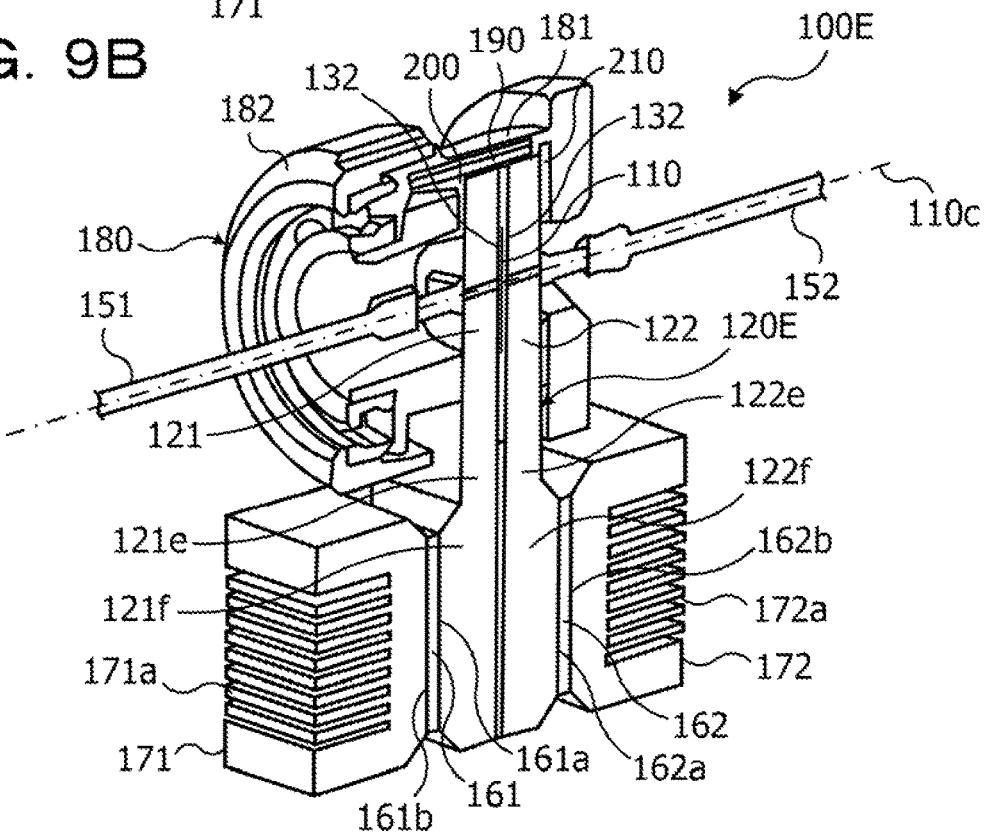
Figure 10A:
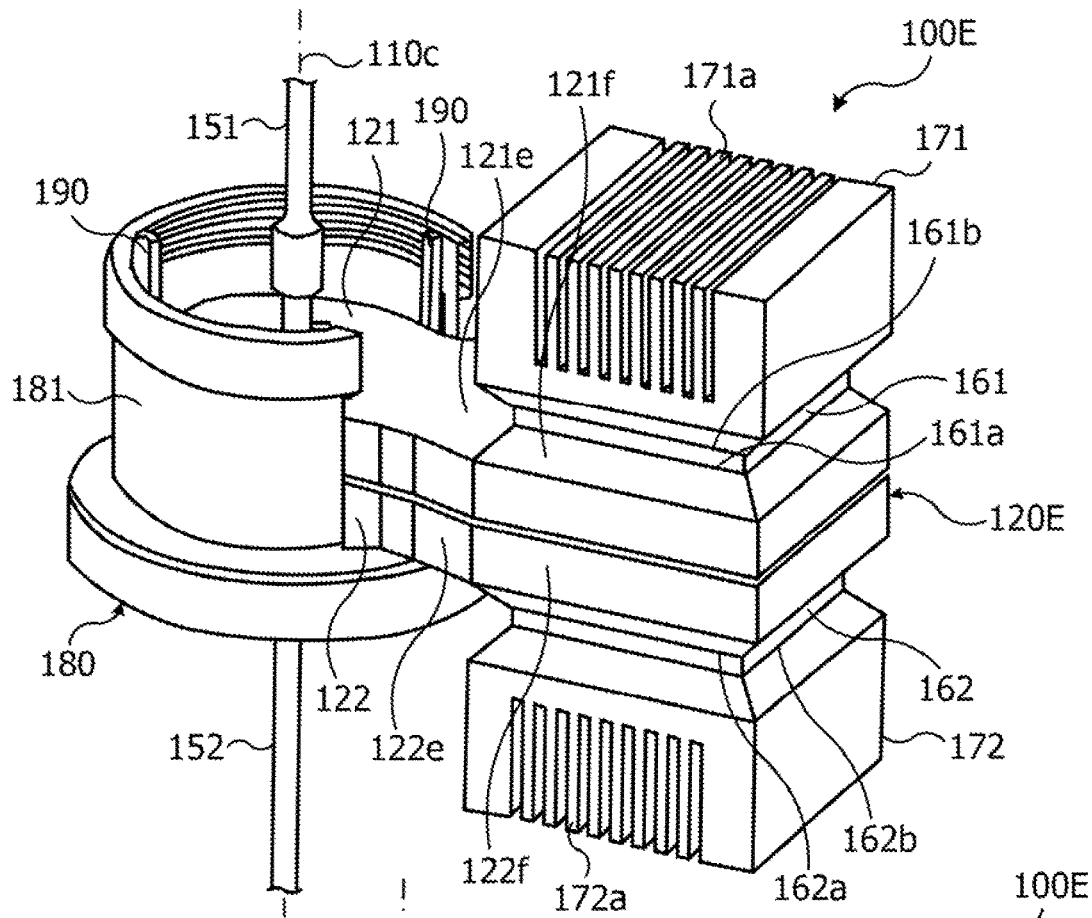
FIGS. 10A and 10B are second diagrams for describing the example of the balanced-type circular disk resonator according to the third embodiment.
Figure 10B:
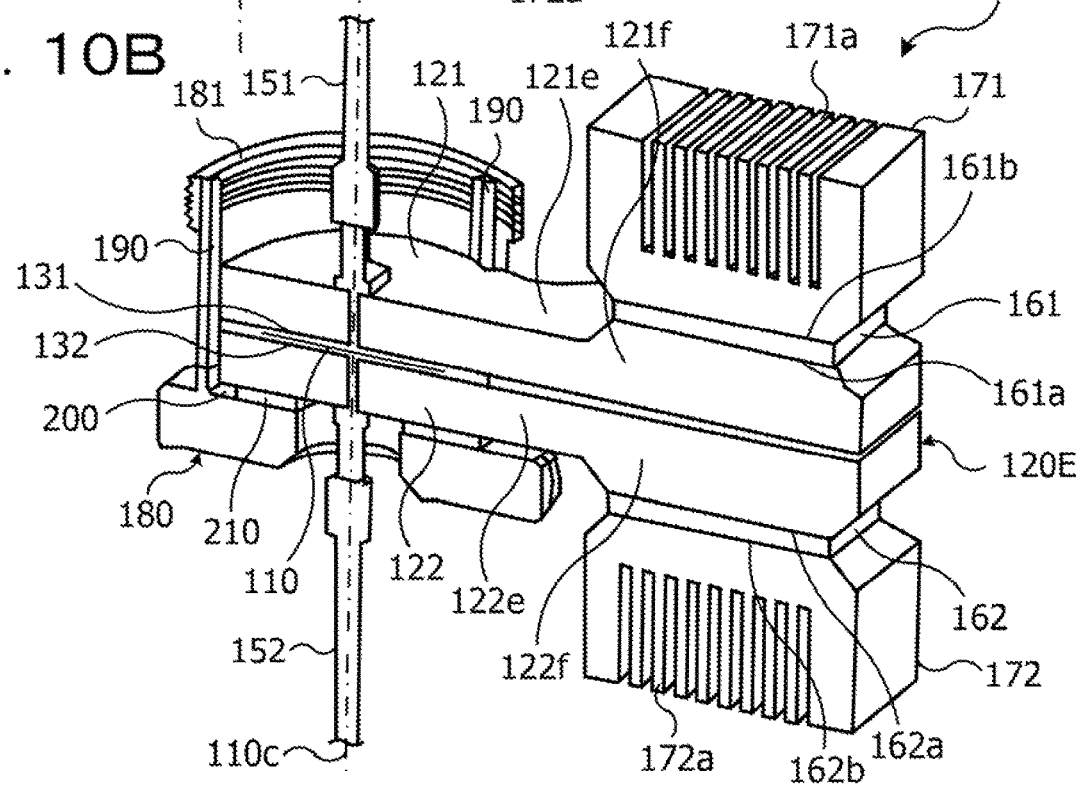

FIGS. 9A to 10B are diagrams for describing a balanced-type circular disk resonator according to a third embodiment. Each of FIGS. 9A and 10A schematically illustrates an external appearance perspective view of a main part of the example of the balanced-type circular disk resonator. Each of FIGS. 9B and 10B schematically illustrates a cross-sectional perspective view of the main part of the example of the balanced-type circular disk resonator. Each of the FIGS. 10A and 10B omits the illustration of a certain element (a front casing to be described later) illustrated in each of FIGS. 9A and 9B. Each of FIGS. 9B and 10B is a cross-sectional view of main part corresponding to a cross-sectional plane along the center axis of the circular conductive foil in each of FIGS. 9A and 10A.

A balanced-type circular disk resonator 100E illustrated in FIGS. 9A and 9B as well as FIGS. 10A and 10B includes a conductive member 120E provided with the conductive plate 121 and the conductive plate 122. The conductive member 120E further includes a coupling conductor 121e continuously coupled to the conductive plate 121, a coupling conductor 121f continuously coupled thereto, a coupling conductor 122e continuously coupled to the conductive plate 122, and a coupling conductor 122f continuously coupled thereto. The circular conductive foil 110, the dielectric board 131, and the dielectric board 132 are arranged and sandwiched between the conductive plate 121 and the conductive plate 122 of the above-described conductive member 120E. The one surface 161a of the Peltier element 161 and the one surface 162ae of the Peltier element 162 are coupled to surfaces of the coupling conductor 121f and the coupling conductor 122f of the conductive member 120E, respectively, which are located opposite to their surfaces facing each other. The heatsink 171 provided with the fins 171a is coupled to the other surface 161b of the Peltier element 161, which is located opposite to the one surface 161a to which the coupling conductor 121f is coupled. The heatsink 172 provided with the fins 172a is coupled to the other surface 162b of the Peltier element 162, which is located opposite to the one surface 162a to which the coupling conductor 122f is coupled.

The casing 180 including the rear casing 181 and the front casing 182 is provided outside of the conductive plate 121 and the conductive plate 122 of the balanced-type circular disk resonator 100E. The multiple (three in this example) pins 190, each having a length extending across the conductive plate 121 and the conductive plate 122, are provided between the rear casing 181 and the conductive plate 121 and between the rear casing 181 and the conductive plate 122 of the balanced-type circular disk resonator 100E while being in contact therewith. The air layer 200 is formed in the space defined between the rear casing 181 and the conductive plate 121 and between the rear casing 181 and the conductive plate 122 as a result of interposing the pins 190 between the rear casing 181 and the conductive plate 121 and between the rear casing 181 and the conductive plate 122. The heat insulation material 210 may be provided in that space. The air layer 200 in the space between the rear casing 181 and the conductive plate 121 and between the rear casing 181 and the conductive plate 122 and the heat insulation material 210 provided in the space collectively function as the heat insulation layer that suppresses the thermal conduction between the rear casing 181 and the conductive plate 121 and between the rear casing 181 and the conductive plate 122.

Various materials including a metal such as stainless steel, a heat resistant resin such as epoxy resin, and a ceramic may be used for the rear casing 181, the front casing 182, and the pins 190. The pins 190 are attached to the rear casing 181 in advance, for example, and brought into contact with the conductive plate 121 and the conductive plate 122 by putting the rear casing 181 over the outside of the conductive plate 121 and the conductive plate 122 that sandwich the circular conductive foil 110 as well as the dielectric board 131 and the dielectric board 132. In light of suppressing the thermal conduction between the rear casing 181 and the conductive plate 121 and between the rear casing 181 and the conductive plate 122, each pin 190 is formed into such a shape that successfully reduces the contact area with each of the conductive plate 121 and the conductive plate 122, for example.

The excitation wire 151 and the excitation wire 152 are coupled to the positions of the excitation hole 141 of the conductive plate 121 and the excitation hole 142 of the conductive plate 122 of the balanced-type circular disk resonator 100E, respectively. A coaxial cable, for example, is used for each of the excitation wire 151 and the excitation wire 152. The excitation is brought about by electric field coupling by using the excitation wire 151 and the excitation wire 152 through the excitation hole 141 and the excitation hole 142 provided on the center axis 110c of the circular conductive foil 110. For example, a resonant electromagnetic wave inputted from the excitation wire 151 coupled to the one conductive plate 121 is outputted from the excitation wire 152 coupled to the other conductive plate 122. The relative permittivity and the dissipation factor of each of the dielectric board 131 and the dielectric board 132 targeted for measurement are measured based on a resonance frequency and a value Q at no load which are measured with the balanced-type circular disk resonator 100E.

Although FIGS. 9A and 9B as well as FIGS. 10A and 10B illustrate a state where the excitation wire 151 and the excitation wire 152 are coupled to the balanced-type circular disk resonator 100E, the excitation wire 151 and the excitation wire 152 may be coupled at the time of measurement of the dielectric properties of the dielectric board 131 and the dielectric board 132.

The balanced-type circular disk resonator 100E uses the Peltier element 161 and the Peltier element 162 so as to adjust the temperatures of the conductive plate 121 and the conductive plate 122 and hence to adjust the dielectric board 131 and the dielectric board 132 to the predetermined measurement temperature, and then the measurement of the dielectric properties takes place as discussed above.

Each of the coupling conductor 121e and the coupling conductor 121f interposed between the conductive plate 121 and the Peltier element 161 adopts a shape designed for the thermal conduction between the conductive plate 121 and the Peltier element 161. For example, a shape that gradually increases its width or thickness toward the conductive plate 121, the coupling conductor 121e, and the coupling conductor 121f is adopted herein. Likewise, each of the coupling conductor 122e and the coupling conductor 122f interposed between the conductive plate 122 and the Peltier element 162 adopts a shape designed for the thermal conduction between the conductive plate 122 and the Peltier element 162. For example, a shape that gradually increases its width or thickness toward the conductive plate 122, the coupling conductor 122e, and the coupling conductor 122f is adopted herein.

The measurement of the dielectric properties by using the balanced-type circular disk resonator 100E having the aforementioned configuration will now be described.

Figure 11:
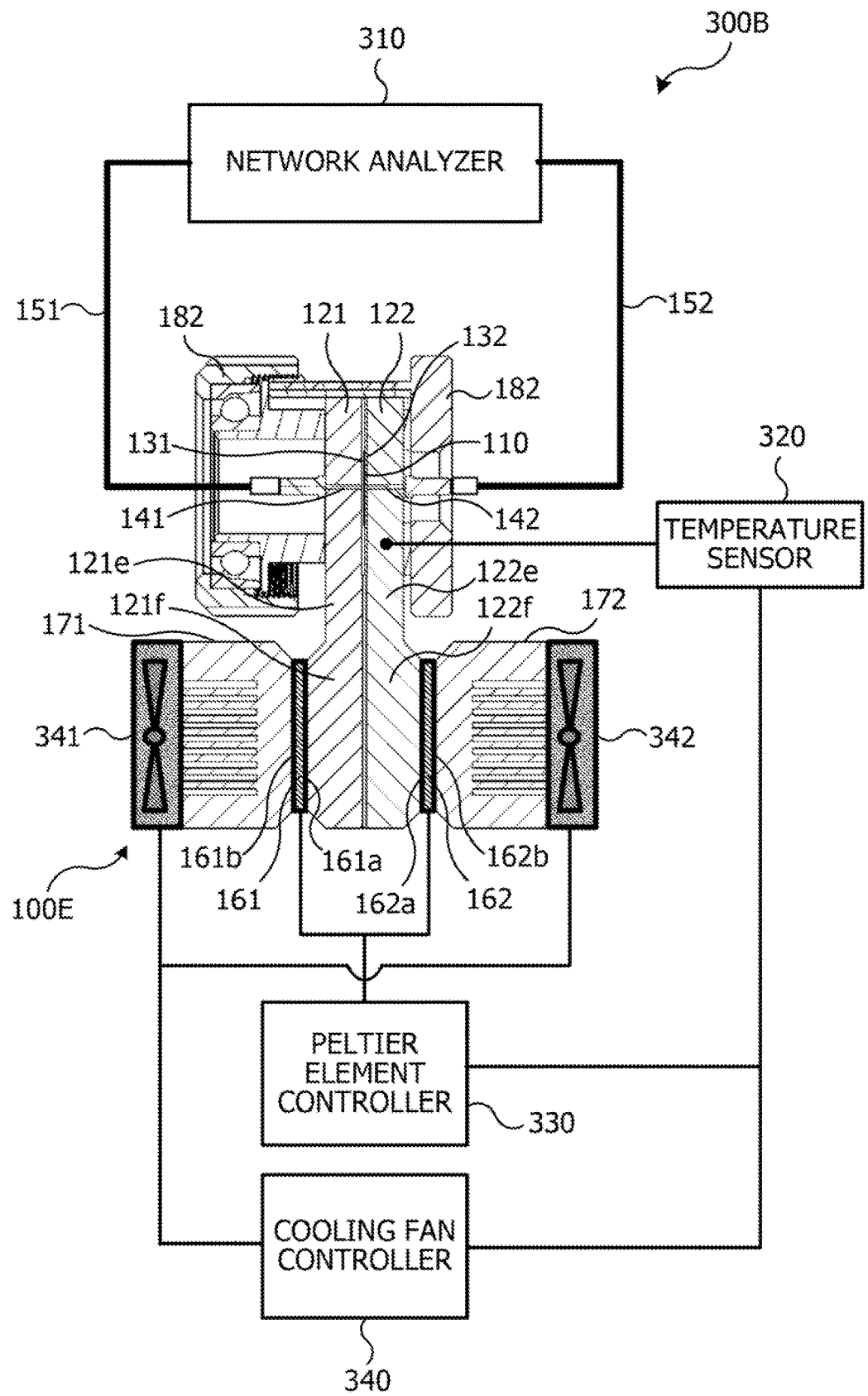
FIG. 11 is a diagram for describing an example of a dielectric property measurement system using the balanced-type circular disk resonator according to the third embodiment.

FIG. 11 is a diagram for describing an example of a dielectric property measurement system using the balanced-type circular disk resonator according to the third embodiment.

A dielectric property measurement system 300B illustrated in FIG. 11 includes the balanced-type circular disk resonator 100E, the network analyzer 310, the temperature sensor 320, the Peltier element controller 330, and a cooling fan controller 340.

The balanced-type circular disk resonator 100E is coupled to the network analyzer 310 by using the excitation wire 151 and the excitation wire 152 each adopting the coaxial cable. The excitation wire 151 is coupled to the position of the excitation hole 141 provided to the one conductive plate 121 of the balanced-type circular disk resonator 100E while the excitation wire 152 is coupled to the position of the excitation hole 142 provided to the other conductive plate 122 thereof.

For example, an electromagnetic wave outputted from the network analyzer 310 is inputted to the balanced-type circular disk resonator 100E through the excitation wire 151. In the balanced-type circular disk resonator 100E, resonance corresponding to the dielectric property of the dielectric board 131 occurs between the conductive plate 121 and the circular conductive foil 110. The electromagnetic wave leaks out and causes resonance corresponding to the dielectric property of the dielectric board 132 between the circular conductive foil 110 and the conductive plate 122. This electromagnetic wave is then inputted to the network analyzer 310 through the excitation wire 152. A resonance waveform is obtained by using the output of the electromagnetic wave in a predetermined frequency range using the network analyzer 310 to the balanced-type circular disk resonator 100E and using the input from the balanced-type circular disk resonator 100E to the network analyzer 310 corresponding thereto and the resonance frequency and the value Q at no load are thus measured. The relative permittivity and the dissipation factor of each of the dielectric board 131 and the dielectric board 132 targeted for measurement are measured based on the resonance frequency and the value Q at no load thus measured.

The temperature sensor 320 of the dielectric property measurement system 300B detects temperatures of the conductive plate 121 and the conductive plate 122. The temperature sensor 320 may detect temperatures of the coupling conductor 121e or the coupling conductor 121f coupled to the conductive plate 121 and of the coupling conductor 122e or the coupling conductor 122f coupled to the conductive plate 122 as the temperatures of the conductive plate 121 and the conductive plate 122. A thermoelectric couple or the like is used for the temperature sensor 320. A non-contact sensor may be used for the temperature sensor 320.

The Peltier element controller 330 of the dielectric property measurement system 300B controls the magnitude and the polarity of the direct current to be applied to each of the Peltier element 161 and the Peltier element 162 based on the temperatures of the conductive plate 121 and the conductive plate 122 detected by the temperature sensor 320.

In the dielectric property measurement system 300B, a cooling fan 341 and a cooling fan 342 is fitted to the heatsink 171 and the heatsink 172 of the balanced-type circular disk resonator 100E, respectively. The cooling fan controller 340 controls drive and stop of the cooling fan 341 and the cooling fan 342 and also controls flow volumes during the drive thereof based on the temperatures of the conductive plate 121 and the conductive plate 122 detected by the temperature sensor 320.

In the dielectric property measurement system 300B, the measurement of the dielectric properties of the dielectric board 131 and the dielectric board 132 is carried out at the predetermined measurement temperature. In this case, in the dielectric property measurement system 300B, the temperature sensor 320 detects the temperatures of the conductive plate 121 and the conductive plate 122, and the Peltier element controller 330 controls the direct current to be applied to the Peltier element 161 and the Peltier element 162 based on the detected temperatures. In the dielectric property measurement system 300B, the cooling fan controller 340 further controls the drive and stop of the cooling fan 341 and the cooling fan 342 and also controls the flow volumes during the drive thereof based on the temperatures of the conductive plate 121 and the conductive plate 122 detected by the temperature sensor 320.

In the Peltier element 161 and the Peltier element 162, heat generation occurs on the coupling conductor 121f side and the coupling conductor 122f side while heat absorption occurs on the heatsink 171 side and the heatsink 172 side based on the direct current applied by the Peltier element controller 330, for example. Alternatively, in the Peltier element 161 and the Peltier element 162, heat absorption occurs on the coupling conductor 121f side and the coupling conductor 122f side while heat generation occurs on the heatsink 171 side and the heatsink 172 side based on the direct current applied by the Peltier element controller 330.

In the case of heating the conductive plate 121 and the conductive plate 122, the Peltier element controller 330 controls the Peltier element 161 and the Peltier element 162 in such a way as to bring about the heat generation on the surface 161a and the surface 162a on the coupling conductor 121f side and the coupling conductor 122f side. The heatsink 171 and the heatsink 172 contribute to cooling of the surface 161b and the surface 162b on the heatsink 171 side and the heatsink 172 side where the heat absorption of the Peltier element 161 and the Peltier element 162 takes place. Since the cooling fan controller 340 drives the cooling fan 341 and the cooling fan 342 at predetermined air volumes, the surface 161b and the surface 162b of the Peltier element 161 and the Peltier element 162 on the heatsink 171 side and the heatsink 172 side that cause heat absorption are efficiently cooled.

In the case of cooling the conductive plate 121 and the conductive plate 122, the Peltier element controller 330 controls the Peltier element 161 and the Peltier element 162 in such a way as to bring about the heat absorption on the surface 161a and the surface 162a on the coupling conductor 121f side and the coupling conductor 122f side. The heatsink 171 and the heatsink 172 contribute to cooling of the surface 161b and the surface 162b on the heatsink 171 side and the heatsink 172 side where the heat generation of the Peltier element 161 and the Peltier element 162 takes place. Since the cooling fan controller 340 drives the cooling fan 341 and the cooling fan 342 at the predetermined air volumes, the surface 161b and the surface 162b of the Peltier element 161 and the Peltier element 162 on the heatsink 171 side and the heatsink 172 side and that cause heat generation are efficiently cooled.

As described above, in the dielectric property measurement system 300B, the temperatures of the conductive plate 121 and the conductive plate 122 are detected by the temperature sensor 320. Based on the temperatures detected by the temperature sensor 320, the Peltier element 161 and the Peltier element 162 are controlled by the Peltier element controller 330 while the cooling fan 341 and the cooling fan 342 are controlled by the cooling fan controller 340. Accordingly, the heat transfers to the conductive plate 121 and the conductive plate 122 or from the conductive plate 121 and the conductive plate 122 through the coupling conductor 121e and the coupling conductor 121f as well as the coupling conductor 122e and the coupling conductor 122f, and the temperatures of the conductive plate 121 and the conductive plate 122 are thus adjusted. As a consequence of the control of the Peltier element 161 and the Peltier element 162 and the control of the cooling fan 341 and the cooling fan 342, the temperatures of the conductive plate 121 and the conductive plate 122 are adjusted whereby the dielectric board 131 and the dielectric board 132 are adjusted to the predetermined measurement temperature. In the dielectric property measurement system 300B, the dielectric board 131 and the dielectric board 132 are thus adjusted to the predetermined measurement temperature and are subjected to the measurement of the dielectric properties as described above.

In the dielectric property measurement system 300B, the dielectric board 131 and the dielectric board 132 are adjusted to the predetermined measurement temperature by using the temperature sensor 320, the Peltier element controller 330, and the cooling fan controller 340. As a consequence, the balanced-type circular disk resonator 100E does not have to be arranged in the isothermal bath at the time of measurement of the dielectric properties. Since the balanced-type circular disk resonator 100E is not arranged in the isothermal bath, the excitation wire 151 and the excitation wire 152 (or portions thereof) coupled to the balanced-type circular disk resonator 100E are kept from being arranged in the isothermal bath. This configuration suppresses deterioration of the excitation wire 151 and the excitation wire 152 by heat, and the occurrence of errors in the measurement of the dielectric properties due to effects of the temperature dependencies of the excitation wire 151 and the excitation wire 152. According to the balanced-type circular disk resonator 100E and the dielectric property measurement system 300B using the same, it is possible to measure the dielectric properties of the dielectric board 131 and the dielectric board 132 at the predetermined measurement temperature at high accuracy.

In the balanced-type circular disk resonator 100E, the excitation wire 151 and the excitation wire 152 coupled thereto are not arranged in the isothermal bath. Accordingly, the temperature dependencies of the excitation wire 151 and the excitation wire 152 do not have to be acquired in advance or acquired in advance at each time the measurement takes place. The measured values of the dielectric properties do not have to be corrected based on the temperature dependencies of the excitation wire 151 and the excitation wire 152 thus obtained. According to the balanced-type circular disk resonator 100E and the dielectric property measurement system 300B using the same, it is possible to suppress an increase in the number of steps of measurement, complication associated therewith, and so forth.

In the balanced-type circular disk resonator 100E, the temperatures of the conductive plate 121 and the conductive plate 122 are adjusted by using the Peltier element 161 and the Peltier element 162 as well as the cooling fan 341 and the cooling fan 342, whereby the temperatures of the dielectric board 131 and the dielectric board 132 are adjusted. The use of the Peltier element 161 and the Peltier element 162 as well as the cooling fan 341 and the cooling fan 342 makes it possible to adjust the temperatures of the dielectric board 131 and the dielectric board 132 quickly as compared to the case of using the isothermal bath. In this way, it is possible to reduce measurement time for each measurement temperature of the dielectric properties of the dielectric board 131 and the dielectric board 132, and to avoid prolonged measurement such as day-long work even in the case of carrying out the measurement at two or more measurement temperatures. In the balanced-type circular disk resonator 100E, the measurement time is reduced approximately to one-tenth as compared to the case of using the isothermal bath. According to the balanced-type circular disk resonator 100E and the dielectric property measurement system 300B using the same, it is possible to measure the dielectric properties of the dielectric board 131 and the dielectric board 132 at the predetermined measurement temperature in relatively a short time.

According to the balanced-type circular disk resonator 100E and the dielectric property measurement system 300B using the same, it is possible to measure the dielectric properties of the dielectric board 131 and the dielectric board 132 at the predetermined measurement temperature efficiently and at high accuracy.

In the balanced-type circular disk resonator 100E, the pins 190 are interposed between the rear casing 181 and the conductive plate 121 and between the rear casing 181 and the conductive plate 122 so as to form the space. Accordingly, it is possible to diminish the effect of the outside temperature on the temperatures of the conductive plate 121 and the conductive plate 122. This makes it possible to carry out the adjustment of the temperatures of the conductive plate 121 and the conductive plate 122 as well as the dielectric board 131 and the dielectric board 132 by using the Peltier element 161 and the Peltier element 162 at high accuracy. For example, the space in the size corresponding to the height of the pins 190 is formed by putting the rear casing 181 that attach the pins 190 in advance in such a way that the pins 190 come into contact with the conductive plate 121 and the conductive plate 122. The position of the rear casing 181 is also aligned with the conductive plate 121 and the conductive plate 122 by using the pins 190 having the prescribed height Provision of the pins 190 makes it possible to achieve heat insulation of the balanced-type circular disk resonator 100E, and to improve efficiency and simplification of assembly work thereof.

According to the balanced-type circular disk resonator 100E, the elements for the temperature adjustment, for example, the coupling conductor 121e, the coupling conductor 121f, the coupling conductor 122e, the coupling conductor 122f, the Peltier element 161, and the Peltier element 162 are coupled to side surfaces of the conductive plate 121 and the conductive plate 122 without changing the shapes of the conductive plate 121 and the conductive plate 122. This makes it possible to achieve the temperature adjustment while suppressing degradation of axial alignment accuracy of the conductive plate 121 and the conductive plate 122 (as well as the excitation hole 141 and the excitation hole 142 thereof) relative to the center axis 110c of the circular conductive foil 110 and the occurrence of undesirable resonance.

FIG. 11 illustrates the example of the dielectric property measurement system 300B that includes the cooling fan 341 and the cooling fan 342 coupled to the Peltier element 161 and the Peltier element 162, and the cooling fan controller 340 that controls the cooling fan 341 and the cooling fan 342. Besides the cooling fan 341 and the cooling fan 342 described above, various cooling devices may be coupled to the Peltier element 161 and the Peltier element 162.

Figure 12:
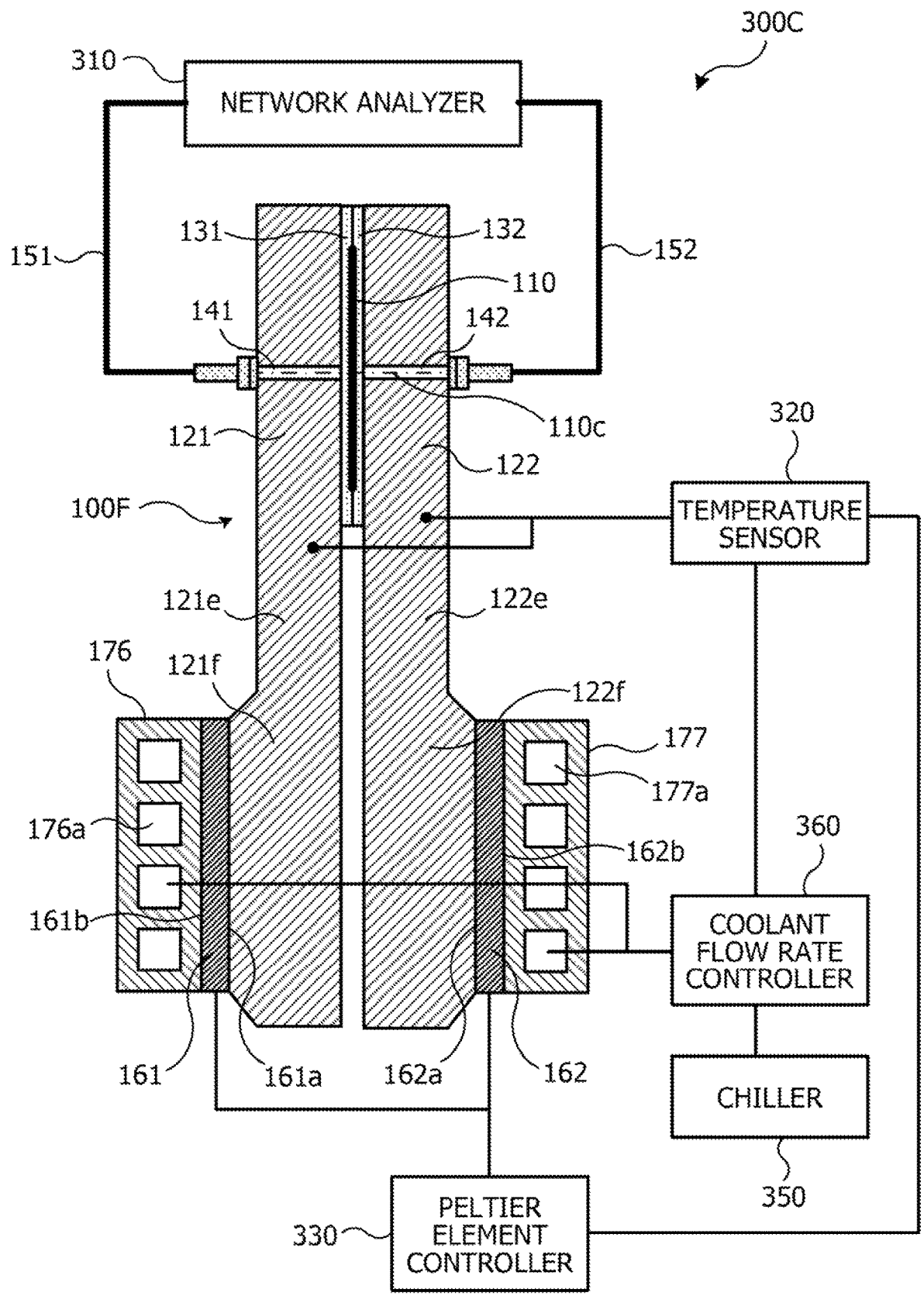
FIG. 12 is a diagram for describing another example of the dielectric property measurement system using the balanced-type circular disk resonator according to the third embodiment.

FIG. 12 is a diagram for describing another example of the dielectric property measurement system using the balanced-type circular disk resonator according to the third embodiment. FIG. 12 illustrates certain elements of the balanced-type circular disk resonator used in the dielectric property measurement system.

In a dielectric property measurement system 300C illustrated in FIG. 12, the one surface 161a of the Peltier element 161 is coupled to the coupling conductor 121f that is linked to the conductive plate 121 of the balanced-type circular disk resonator 100F through the coupling conductor 121e, and a liquid-cooled heatsink 176 is coupled to the other surface 161b of the Peltier element 161. In the dielectric property measurement system 300C, the one surface 162a of the Peltier element 162 is coupled to the coupling conductor 122f that is linked to the conductive plate 122 of the balanced-type circular disk resonator 100F through the coupling conductor 122e, and a liquid-cooled heatsink 177 is coupled to the other surface 162b of the Peltier element 162. The heatsink 176 and the heatsink 177 include a flow channel 176a and a flow channel 177a provided inside, respectively. A coolant such as water is fed to the flow channel 176a of the heatsink 176 and the flow channel 177a of the heatsink 177, which is circulated to and from a chiller 350. A coolant flow rate controller 360 for controlling a flow rate of the coolant (including stop of circulation thereof) is provided on a circulation channel of the coolant between the chiller 350 and the heatsink 176 and between the chiller 350 and the heatsink 177.

The Peltier element 161 and the Peltier element 162 are used at the time of measurement of the dielectric properties. In this instance, the conductive plate 121 and the conductive plate 122 are either heated or cooled whereby the dielectric board 131 and the dielectric board 132 are adjusted to the predetermined measurement temperature. In the dielectric property measurement system 300C, the temperature of the conductive plate 121 and the conductive plate 122 at this time are detected by the temperature sensor 320, and the Peltier element 161 and the Peltier element 162 are controlled by the Peltier element controller 330 based on the detected temperatures. In the dielectric property measurement system 300C, the flow rate of the coolant fed into the heatsink 176 and the heatsink 177 is also controlled by the coolant flow rate controller 360 based on the temperatures of the conductive plate 121 and the conductive plate 122 detected by the temperature sensor 320. Since the coolant flow rate controller 360 controls the flow rate of the coolant, the surface 161b and the surface 162b on the heatsink 176 side of the Peltier element 161 and the surface 162b on the heatsink 177 side of the Peltier element 162 that cause heat absorption or heat generation are efficiently cooled.

The balanced-type circular disk resonator 100F including the liquid-cooled heatsink 176 and the liquid-cooled heatsink 177 as described above and the dielectric property measurement system 300C using the same also make it possible to measure the dielectric properties of the dielectric board 131 and the dielectric board 132 at the predetermined measurement temperature efficiently and at high accuracy.

According to an aspect of the embodiments, it is possible to measure a dielectric property of a dielectric board at a predetermined temperature by using a balanced-type circular disk resonator.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A balanced-type circular disk resonator, comprising:
    a circular conductive layer;
    a conductive member including:
    a first conductive portion provided on a first surface of the circular conductive layer to enable a first dielectric board, a dielectric property of which is measured, to be placed between the first conductive portion and the circular conductive layer; and
    a second conductive portion provided on a second surface of the circular conductive layer to enable a second dielectric board, a dielectric property of which is measured, to be placed between the second conductive portion and the circular conductive layer, the second surface being opposite to the first surface with regard to the circular conductive layer;
    a third conductive portion coupled to the first conductive portion;
    a fourth conductive portion coupled to the second conductive portion; and
    a temperature adjustment unit coupled to the conductive member, configured to adjust temperatures of the first conductive portion and the second conductive portion, coupled to the first conductive portion through the third conductive portion, and coupled to the second conductive portion through the fourth conductive portion.

2. The balanced-type circular disk resonator according to claim 1, wherein the temperature adjustment unit includes:
    a first temperature adjustment element coupled to the first conductive portion and configured to heat or cool the first conductive portion; and
    a second temperature adjustment element coupled to the second conductive portion and configured to heat or cool the second conductive portion.

3. The balanced-type circular disk resonator according to claim 2, further comprising:
    a first heatsink coupled to the first temperature adjustment element; and
    a second heatsink coupled to the second temperature adjustment element.

4. The balanced-type circular disk resonator according to claim 1, wherein the temperature adjustment unit includes a temperature adjustment element coupled to the first conductive portion and the second conductive portion and configured to heat or cool the first conductive portion and the second conductive portion.

5. The balanced-type circular disk resonator according to claim 4, further comprising: a heatsink coupled to the temperature adjustment element.

6. The balanced-type circular disk resonator according to claim 1, further comprising:
a first excitation hole provided to the first conductive portion at a position on a center axis of the circular conductive layer;
a first excitation wire coupled to a position of the first excitation hole of the first conductive portion;
a second excitation hole provided to the second conductive portion at a position on the center axis of the circular conductive layer; and
a second excitation wire coupled to a position of the second excitation hole of the second conductive portion.

7. The balanced-type circular disk resonator according to claim 1, further comprising:
a casing provided outside of the first conductive portion and outside of the second conductive portion; and
a heat insulation layer provided between the casing and the first conductive portion and between the casing and the second conductive portion.

8. The balanced-type circular disk resonator according to claim 7, further comprising:
a plurality of pins provided between the casing and the first conductive portion and between the casing and the second conductive portion, and coming into contact with the casing, the first conductive portion, and the second conductive portion.

9. A dielectric property measurement method, comprising:
adjusting temperatures of a first conductive portion and a second conductive portion of a conductive member included in a balanced-type circular disk resonator by a temperature adjustment unit of the balanced-type circular disk resonator, including a circular conductive layer, the first conductive portion provided on a first surface of a circular conductive layer of the balanced-type circular disk resonator to enable a first dielectric board to be placed between the first conductive portion and the circular conductive layer, the second conductive portion being provided on a second surface of the circular conductive layer to enable a second dielectric board to be placed between the second conductive portion and the circular conductive layer, the second surface being opposite to the first surface with regard to the circular conductive layer;
measuring a dielectric property of the first dielectric board provided between the circular conductive layer and the first conductive portion, the temperature of which is adjusted; and
measuring a dielectric property of the second dielectric board provided between the circular conductive layer and the second conductive portion, the temperature of which is adjusted, the conductive member includes:
a third conductive portion coupled to the first conductive portion; and
a fourth conductive portion coupled to the second conductive portion,
the temperature adjustment unit is coupled to the first conductive portion through the third conductive portion and is coupled to the second conductive portion through the fourth conductive portion.

10. A dielectric property measurement system, comprising:
a balanced-type circular disk resonator including:
a circular conductive layer;
a conductive member including:
a first conductive portion provided on a first surface of the circular conductive layer to enable a first dielectric board, a dielectric property of which is measured, to be placed between the first conductive portion and the circular conductive layer; and
a second conductive portion provided on a second surface of the circular conductive layer to enable a second dielectric board, a dielectric property of which is measured, to be placed between the second conductive portion and the circular conductive layer, the second surface being opposite to the first surface with regard to the circular conductive layer; and
a temperature adjustment unit coupled to the conductive member and configured to adjust temperatures of the first conductive portion and the second conductive portion;
a network analyzer coupled to the balanced-type circular disk resonator and configured to measure dielectric properties of the first dielectric board and the second dielectric board;
a temperature sensor configured to detect the temperatures of the first conductive portion and the second conductive portion in a case of measurement of the dielectric properties by the network analyzer; and
a controller configured to control adjustment of the temperatures of the first conductive portion and the second conductive portion by the temperature adjustment unit based on the temperatures of the first conductive portion and the second conductive portion detected by the temperature sensor,
the conductive member further includes:
a third conductive portion coupled to the first conductive portion; and
a fourth conductive portion coupled to the second conductive portion,
the temperature adjustment unit is coupled to the first conductive portion through the third conductive portion, and
the temperature adjustment unit is coupled to the second conductive portion through the fourth conductive portion.

* * * * *